(12) United States Patent
Shiodera

(10) Patent No.: US 10,845,445 B2
(45) Date of Patent: Nov. 24, 2020

(54) MAGNETIC RESONANCE IMAGING APPARATUS AND MEDICAL IMAGE PROCESSING APPARATUS

(71) Applicant: Canon Medical Systems Corporation, Otawara (JP)

(72) Inventor: Taichiro Shiodera, Tokyo (JP)

(73) Assignee: Canon Medical Systems Corporation, Otawara (JP)

(*) Notice: Subject to any disclaimer, the term of this patent is extended or adjusted under 35 U.S.C. 154(b) by 27 days.

(21) Appl. No.: 16/210,026

(22) Filed: Dec. 5, 2018

(65) Prior Publication Data
US 2019/0219653 A1    Jul. 18, 2019

(30) Foreign Application Priority Data
Jan. 17, 2018 (JP) .................... 2018-005801

(51) Int. Cl.
| | | |
|---|---|---|
| G01R 33/50 | (2006.01) | |
| G01R 33/44 | (2006.01) | |
| G01R 33/565 | (2006.01) | |
| G01R 33/56 | (2006.01) | |
| G01R 33/54 | (2006.01) | |

(52) U.S. Cl.
CPC .......... *G01R 33/50* (2013.01); *G01R 33/443* (2013.01); *G01R 33/54* (2013.01); *G01R 33/5608* (2013.01); *G01R 33/56536* (2013.01); *G01R 33/56563* (2013.01)

(58) Field of Classification Search
CPC .. G01R 33/443; G01R 33/50; G01R 33/5608; G01R 33/56536
See application file for complete search history.

(56) References Cited

U.S. PATENT DOCUMENTS

| | | | | |
|---|---|---|---|---|
| 2013/0221961 A1* | 8/2013 | Liu | .................. | G01R 33/56545 324/307 |
| 2018/0017652 A1* | 1/2018 | Ye | ...................... | G01R 33/5608 |
| 2018/0059198 A1* | 3/2018 | Shirai | .................... | A61B 5/055 |

OTHER PUBLICATIONS

Chen, Ping-Feng, et al. "Brain MRI T 1-Map and T 1-weighted image segmentation in a variational framework." 2009 IEEE International Conference on Acoustics, Speech and Signal Processing. IEEE, 2009. (Year: 2009).*

(Continued)

*Primary Examiner* — Rishi R Patel
(74) *Attorney, Agent, or Firm* — Oblon, McClelland, Maier & Neustadt, L.L.P.

(57) ABSTRACT

In general, according to the present embodiment, a magnetic resonance imaging apparatus includes sequence control circuitry and processing circuitry. The sequence control circuitry collects MR data corresponding to each of a plurality of echo times. The processing circuitry generates a plurality of magnitude images corresponding to the plurality of echo times based on the MR data. The processing circuitry generates a relaxation time map of tissue based on the plurality of magnitude images. The processing circuitry generates a susceptibility map quantitatively indicating susceptibility values in a subject based on a magnetic field distribution that is generated based on a plurality of phase images corresponding to the plurality of echo times and the relaxation time map.

6 Claims, 16 Drawing Sheets

(56) References Cited

OTHER PUBLICATIONS

"Parameter 'weighting'." Questions and Answers in MRI. 2020 <http://mriquestions.com/meaning-of-weighting.html> (Year: 2020).*

Liu, T. et al. "Morphology Enabled Dipole Inversion (MEDI) from a Single-Angle Acquisition: Comparison with COSMOS in Human Brain Imaging", Magnetic Resonance in Medicine vol. 66, 2011, pp. 777-783.

Liu, J. et al. "Morphology enabled dipole inversion for quantitative susceptibility mapping using structural consistency between the magnitude image and the susceptibility map", NeuroImage vol. 59, 2012, pp. 2560-2568.

* cited by examiner

| | Magnitude signal when TE = 30: Simulated value | T$_2$: Literature value |
|---|---|---|
| Cerebral parenchyma | 0.71 | 90 |
| Globus pallidus | 0.61 | 60 |
| Contrast difference | 15% | 33% |

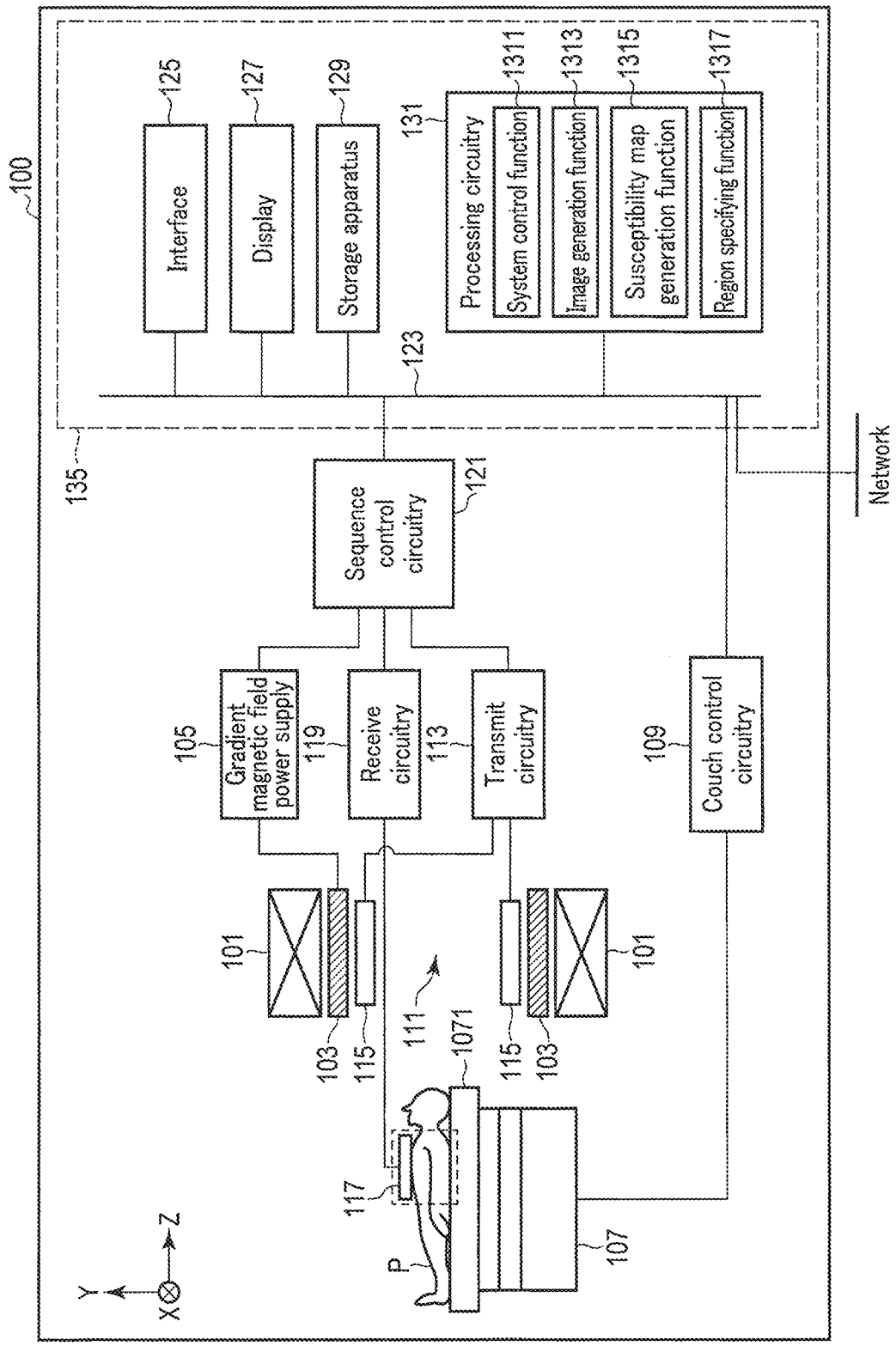
F I G. 11

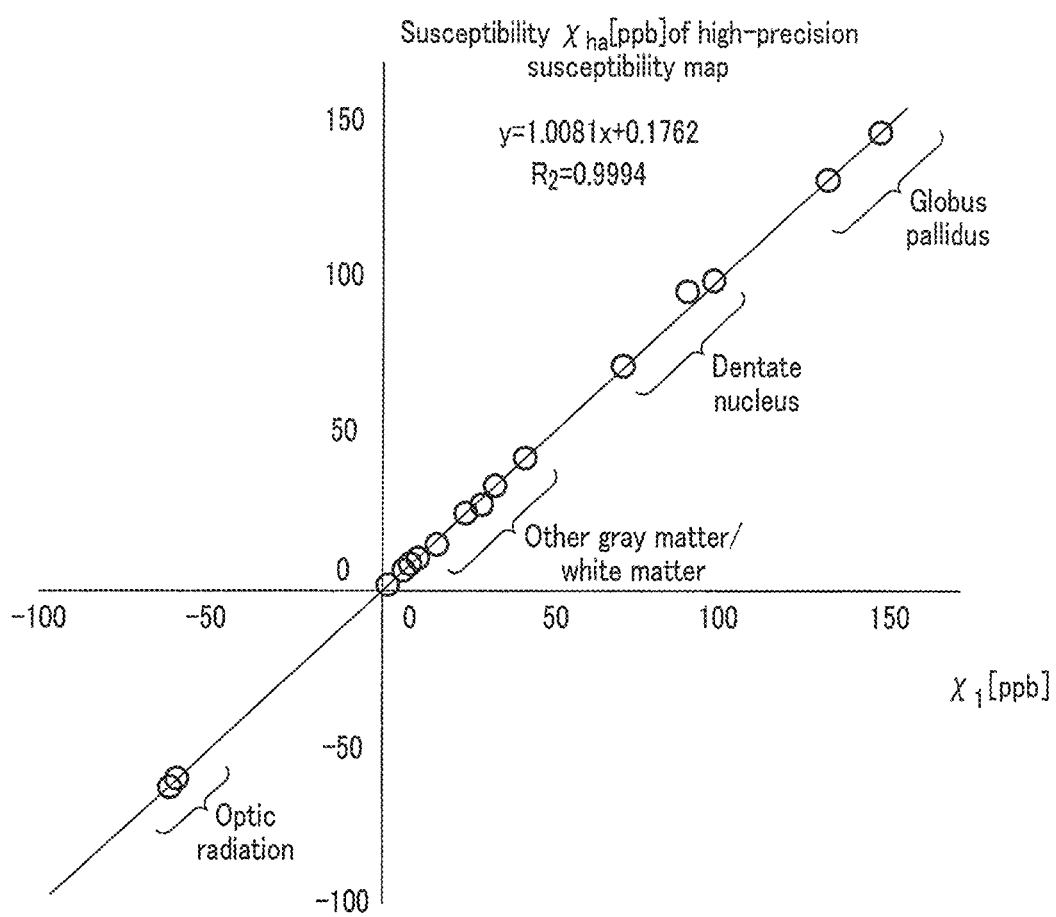
F I G. 18

MAGNETIC RESONANCE IMAGING APPARATUS AND MEDICAL IMAGE PROCESSING APPARATUS

CROSS-REFERENCE TO RELATED APPLICATIONS

This application is based upon and claims the benefit of priority from the prior Japanese Patent Applications No. 2018-005801, filed. Jan. 17, 2018; the entire contents of which are incorporated herein by reference.

FIELD

Embodiments described herein relate generally to a magnetic resonance imaging apparatus and a medical image processing apparatus.

BACKGROUND

There is a conventional technique of generating a susceptibility map indicating susceptibility of tissue in a subject, based on a phase image obtained by a magnetic resonance imaging apparatus. There is a possibility that a denominator in a Fourier transform of a dipole kernel used in converting a phase value into susceptibility for each voxel in the phase image becomes zero. For this reason, generating a susceptibility map from a phase image is an ill-posed problem.

In order to solve the above ill-posed problem, for example, an L1 norm regularization process in which a gradient of susceptibility is used as a regularization term may be used. Since susceptibility is smoothed out with this process, even in a boundary portion (hereinafter, a tissue boundary) between various tissues in a susceptibility map, the susceptibility of the tissue boundary may not be accurately calculated. To prevent susceptibility from being smoothed out in the tissue boundary, a product of an edge and a gradient of susceptibility both detected in a magnitude image as an L1 norm regularization.

If a subject's head is an imaging region, in the tissue boundary between cerebrospinal fluid (CSF) and the cerebral parenchyma, a partial volume effect may cause a shading artifact in the magnitude image. A region where such shading artifact may occur is, for example a region where a signal value of the magnitude image is low, in other words, where reliability of a signal value of the magnitude image is low. Thus, a pseudo edge may be generated in an edge used in L1 norm regularization. If an observation region in the susceptibility map relating to the head is a region in which a contrast may only lightly appear in the magnitude image (e.g., globus pallidus), an edge may not be detected to begin with.

For the above reasons, with any of the foregoing methods, the susceptibility may not be accurately calculated.

BRIEF DESCRIPTION OF THE DRAWINGS

FIG. 11 is a diagram showing an example of an MRI apparatus according to a second embodiment.

FIG. 18 is a drawing showing distribution of susceptibility $\chi_{ha}$ of a high-precision susceptibility map with respect to first susceptibility $\chi_1$ in a non-LF region in the second embodiment.

DETAILED DESCRIPTION

In general, according to the present embodiment, a magnetic resonance imaging apparatus includes sequence control circuitry and processing circuitry.

The sequence control circuitry collects MR data corresponding to each of a plurality of echo times.

The processing circuitry generates a plurality of magnitude images corresponding to the plurality of echo times based on the MR data. The processing circuitry generates a relaxation time map of tissue based on the plurality of magnitude images. The processing circuitry generates a susceptibility map quantitatively indicating susceptibility values in a subject based on the relaxation time map and magnetic field distribution generated by a plurality of phase images corresponding to the plurality of echo times.

An objective of the foregoing is to generate a high-precision susceptibility map.

Hereinafter, embodiments of the magnetic resonance imaging (MRI) apparatus will be described with reference to the drawings. In the following description, structural elements having substantially the same functions and configurations will be denoted by the same reference symbols, and a repetitive description of such elements will be given only where necessary.

First Embodiment

Figure 1:
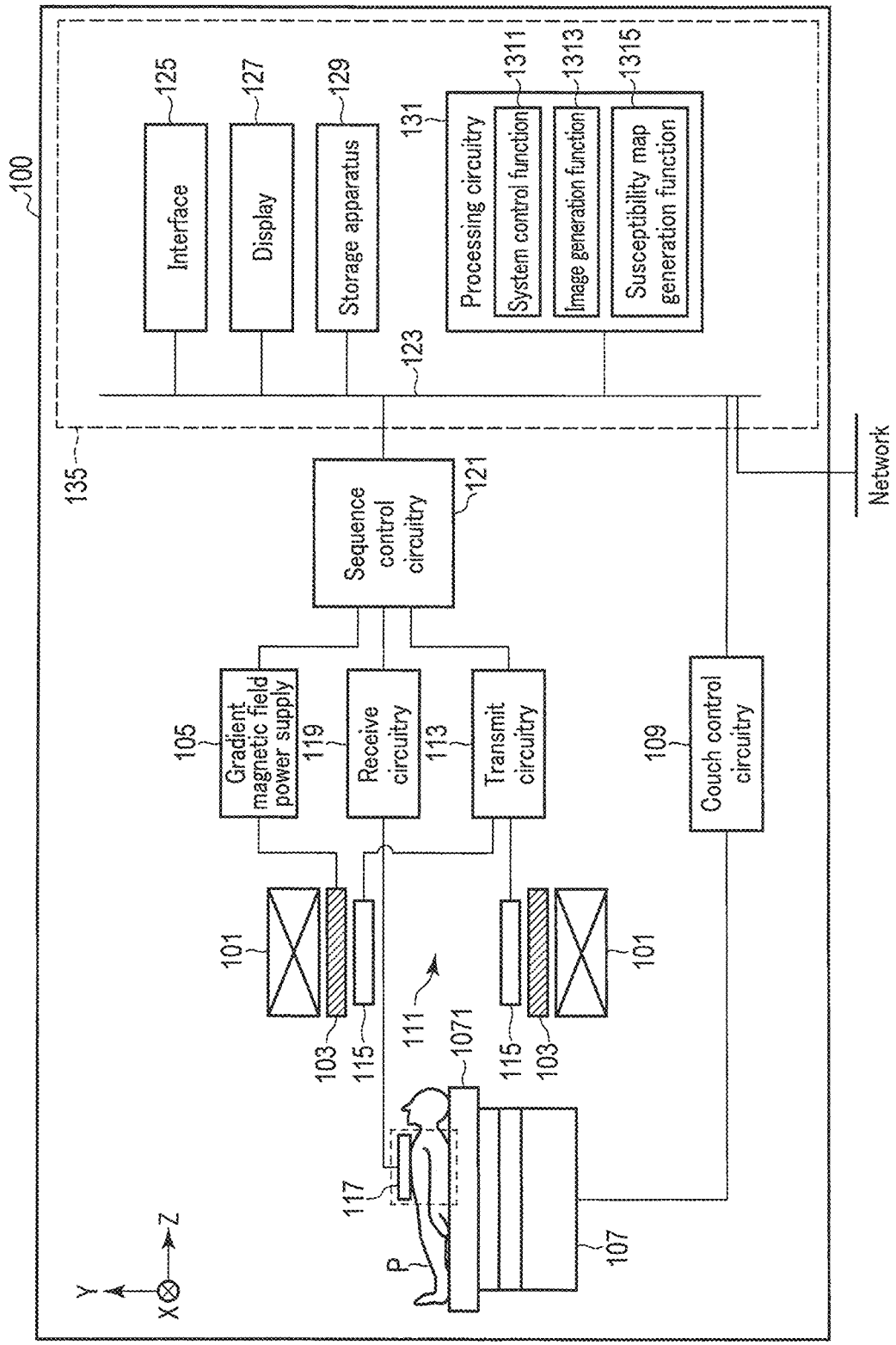
FIG. 1 is a diagram showing an example of an MRI apparatus according to a first embodiment.

The general configuration of an MRI apparatus 100 in the first embodiment will be described with reference to FIG. 1. FIG. 1 is a diagram showing a configuration of the MRI apparatus 100 according to the present embodiment. As shown in FIG. 1, the MRI apparatus 100 of the present embodiment includes a static field magnet 101, a gradient coil 103, a gradient magnetic field power supply 105, a couch 107, couch control circuitry 109, transmit circuitry (transmitter) 113, a transmitter coil 115, a receiver coil 117, receive circuitry (receiver) 119, sequence control circuitry (collection unit) 121, interface circuitry (input unit) 125, a display (display unit) 127, a storage apparatus (storage unit) 129, and processing circuitry (processor) 131. The MRI apparatus 100 may have a hollow cylindrical-shaped shim coil provided between the static field magnet 101 and the gradient coil 103.

The static magnetic field magnet 101 is a magnet formed in a hollow, approximately cylindrical shape. The static magnetic field magnet 101 is not necessarily in an approximately cylindrical shape; it may be formed in an open shape. The static magnetic field magnet 101 generates a uniform static magnetic field $B_0$ in a bore 111. As the static magnetic field magnet 101, a superconductive magnetic is used, for example.

The gradient coil 103 is a coil formed in a hollow cylindrical shape. The gradient coil 103 is arranged inside the static magnetic field magnet 101. The gradient coil 103 is formed by combining three coils respectively corresponding to the X-, Y-, and Z-axes which are orthogonal to each other. The Z-axis direction is defined as the same direction of the static magnetic field $B_0$. The Y-axis direction is a vertical direction, and the X-axis direction is a direction orthogonal to each of the Z-axis and the Y-axis. The three coils of the gradient coil 103 individually receive a current from the gradient magnetic field power supply 105 and respectively generate gradient magnetic fields in which magnetic field intensity changes along each of the X-, Y-, and Z-axes.

The gradient fields along each of the X-, Y-, and Z-axes generated by the gradient coil 103 respectively correspond to, for example, a slice selective gradient field, a phase encode gradient field, and a frequency encode gradient field (readout gradient field). The slice selective gradient field is used to discretionarily determine an imaging slice. The phase encode gradient field is used to change the phase of magnetic resonance (MR) signals in accordance with a spatial position. The frequency encode gradient field is used to change the frequency of MR signals in accordance with spatial positions.

The gradient magnetic field of the X-axis, etc. is used as a re-convergence pulse in which the direction of the gradient magnetic field is twice reversed in order to, for example, re-converge the phase of spins on the X-Y plane in a gradient echo method. The gradient magnetic fields of the X-, Y-, and Z-axes may be used for primary static magnetic field shimming.

The gradient magnetic field power supply 105 is a power supplying apparatus that supplies a current to the gradient coil 103 under the control of the sequence control circuitry 121.

The couch 107 is an apparatus having a couch top 1071 on which a subject P is laid. The couch 107 inserts the couch top 1071 on which the subject P is laid into the bore 111 under the control of the couch control circuitry 109. Normally, the couch 107 is installed in an examination room in such a manner that the longitudinal axis of the couch 107 is parallel to the central axis of the static field magnet 101.

The couch control circuitry 109 is circuitry for controlling the couch 107, and is implemented by a processor, for example. The couch control circuitry 109 drives the couch 107 in accordance with an operator's instruction via the interface 125 to move the couch top 1071 in a longitudinal direction and a vertical direction.

The transmit circuitry 113 supplies a high-frequency pulse corresponding to a Larmor frequency to the transmit coil 115 under the control of the sequence control circuitry 121.

The transmit coil 115 is a radio frequency (RF) coil located inside the gradient coil 103. Upon being supplied with a high-frequency pulse (RF pulse) from the transmit circuitry 113, the transmit coil 115 generates a transmit RF wave that is equivalent to a high-frequency magnetic field. The transmit coil is a whole body (WB) coil, for example. The WB coil may be used as a transmit/receive coil. The transmit coil 115 may also be a WB coil made of a single coil.

The receive coil 117 is an RF coil provided inside the gradient coil 103. The receive coil 117 receives MR signals that are emitted from the subject P, caused by the high frequency magnetic field. The receive coil 117 outputs the received MR signals to the receiver 119. The receive coil 117 is a coil array including, for example, one or more, typically, a plurality of coil elements. FIG. 1 shows the transmit coil 115 and the receive coil 117 as separate RF coils; however, the transmit coil 115 and the receive coil 117 may be embodied as an integrated transmit/receive coil. The transmit/receive coil is, for example, a local transmit/receive RF coil, such as a head coil, to serve an imaging target in the subject P.

The receive circuitry 119 generates, under the control of the sequence control circuitry 121, a digital MR signal, which is digitized complex number data, based on the MR signal that is output from the receive coil 117. Specifically, the receive circuitry 119 performs various types of signal processing to the MR signal that is output from the receive coil 117, and then performs analog-to-digital (A/D) conversion of data to which the variety of signal processing is performed. The receive circuitry 119 performs sampling to the A/D converted data. The receive circuitry 119 thereby generates a digital MR signal (hereinafter referred to as magnetic resonance (MR) data). The receive circuitry 119 outputs the generated MR data to the sequence control circuitry 121.

The sequence control circuitry 121 controls the gradient magnetic field power supply 105, the transmit circuitry 113, and the receive circuitry 119 etc. in accordance with an imaging protocol that is output from the processing circuitry 131, and performs imaging on the subject P. An imaging protocol has different pulse sequences in accordance with a type of examination. In an imaging protocol, defined are a value of a current supplied to the gradient coil 103 by the gradient magnetic field power supply 105, timing of supplying a current to the gradient coil 103 by the gradient magnetic field power supply 105, a magnitude of an RF pulse supplied to the transmit RF coil 115 by the transmit circuitry 113, timing of supplying an RF pulse to the transmit RF coil 115 by the transmit circuitry 113, timing of detecting an MR signal by the receive circuitry 117, and the like.

The interface 125 has circuitry for receiving various types of instructions and information that are input from the operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device provided separately from the present MRI apparatus 100 and outputs the received electrical signal to various circuits.

The display 127, under the control by a system control function 1311 in the processing circuitry 131, for example, displays various images and information such as an MR image reconstructed by an image generation function 1313, a susceptibility map generated by a susceptibility map generation function 1315, etc. A susceptibility map is an image that quantitatively indicates susceptibility values in a subject. The display device 127 is, for example, a CRT display, a liquid crystal display, an organic EL display, an LED display, a plasma display, a monitor, or any other display known in this technical field.

The storage apparatus 129 stores MR data filled in k-space by the image generation function 1313, and image data etc. generated by the image generation function 1313. The storage apparatus 129 stores various types of imaging protocols, conditions for imaging etc., including a plurality of imaging parameters that define imaging protocols. The storage apparatus 129 stores programs corresponding to various functions executed by the processing circuitry 131. For example, the storage apparatus 129 is, for example, a semiconductor memory element, such as a RAM (Random Access Memory), a flash memory, a hard disk drive, a solid state drive, or an optical disk, etc. The storage apparatus 129 may be a drive, etc. configured to read and write various kinds of information with respect to a portable storage medium such as a CD-ROM drive, a DVD drive, or a flash memory, etc. In other words, the storage apparatus 129 is realized by, for example a memory or a storage, etc.

The processing circuitry 131 includes a processor (not shown in the drawings), and a memory (not shown in the drawings), such as a ROM or a RAM, as hardware resources, to control the MRI apparatus 100. The processing circuitry 131 includes a system control function 1311, an image generation function 1313, and a susceptibility map generation function 1315. The various types of functions executed by the system control function 1311, the image generation function 1313, and the susceptibility map generation function 1315, are stored in the storage apparatus 129 in a form of a computer-executable program. The processing circuitry 131 is a processor which reads a program corresponding to each function from the memory apparatus 129 and executes the program to realize the function corresponding to the program. In other words, the processing circuitry 131, in a state where each of the programs is read, has a plurality of the functions etc. shown in the processing circuitry 131 of FIG. 1.

It was described with reference to FIG. 1 that those functions are realized in single processing circuitry 131; however, a plurality of independent processors may be combined to constitute the processing circuitry 131, and the functions may be realized by a program by each of the processors. In other words, each of the above-mentioned functions may be configured as a program, and single processing circuitry executes each program, or a specific function may be implemented in exclusive, independent program-execution circuitry. The system control function 1311, the image generation function 1313, and the susceptibility map generation function 1315, of the processing circuitry 131 are examples of a system controller, an image generator, and a susceptibility map generation unit, respectively.

The term "processor" used in the above description means, for example, a CPU (Central Processing Unit), a GPU (Graphical Processing Unit), or circuitry such as an ASIC (Application Specific Integrated Circuit), or a programmable logic device (e.g., an SPLD (Simple Programmable Logic Device), a CPLD (Complex Programmable Logic Device), or a FPGA (Field Programmable Gate Array)).

The processor reads and executes a program stored in the storage apparatus 129 to realize the corresponding function. A program may be directly integrated into the circuitry of the processor, instead of storing the program on the storage apparatus 129. In this case, the function is realized by reading and executing the program integrated into the circuitry. Similarly, each of the couch control circuitry 109, the transmit circuitry 113, the receive circuitry 119, and the sequence control circuitry 121, etc. are also configured as an electronic circuit, such as the above processor.

The processing circuitry 131 controls the MRI apparatus 100 by the system control function 1311. Specifically, the processing circuitry 131 reads the system control program stored in the storage apparatus 129, loads it in the memory, and controls each circuitry of the present MRI apparatus 100 in accordance with the loaded system control program. For example, the processing circuitry 131 reads an imaging protocol from the storage apparatus 129 by the system control function 1311 based on an imaging condition input by the operator via the interface 125. The processing circuitry 131 may generate the imaging protocol based on the imaging condition. The processing circuitry 131 transmits the imaging protocol to the sequence control circuitry 121 to control imaging of the subject P.

The processing circuitry 131 fills MR data along a readout direction of k-space in accordance with an intensity of the readout gradient magnetic field by the image generation function 1313. The processing circuitry 131 generates an MR image by executing a Fourier transform to the MR data filled in k-space. For example, the processing circuitry 131 generates a real image based on real data of the MR data. The processing circuitry 131 generates an imaginary image based on imaginary data of the MR data. The processing circuitry 131 generates magnitude image data using magnitude (absolute value) of the real image and magnitude (absolute value) of the imaginary image. The processing circuitry 131 generates phase image data by calculating an arc tangent ($\tan^{-1}$) to a ratio of the real image to the imaginary image. The processing circuitry 131 outputs an MR image such as magnitude image data and phase image data to the display 127 and the storage apparatus 129. The susceptibility map generation function 1315 that is realized by the processing circuitry 131 will be described later in detail.

The above is the description of the general configuration of the MRI apparatus 100 according to the present embodiment. In the description of the susceptibility map generation function 1315, the collection of MR data relating to various images used for generating a susceptibility map, and the generation of the various images will be first described, and the generation of a susceptibility map will then be described.

Figure 2:
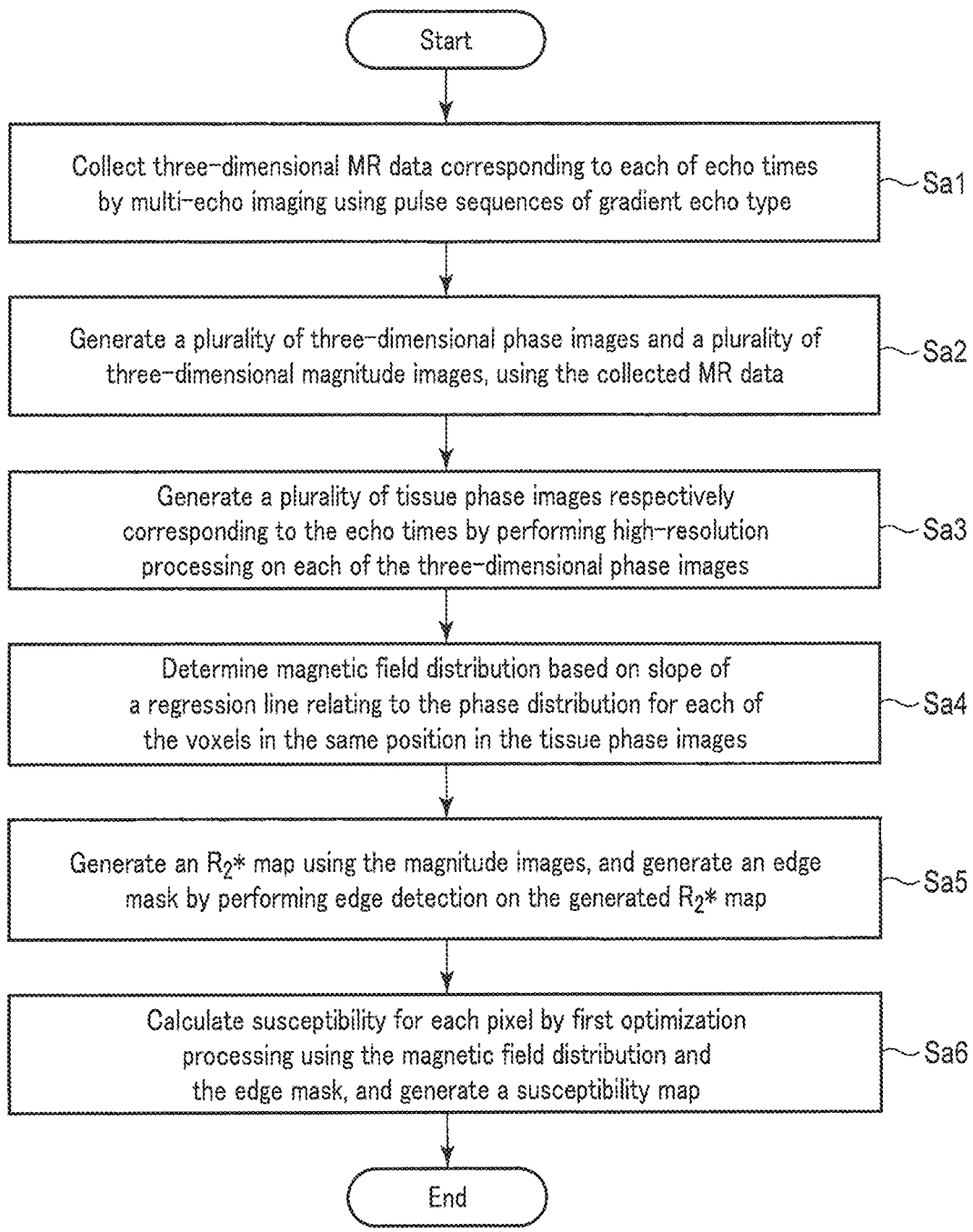
FIG. 2 is a flowchart showing an example of a process procedure relating to generation of a susceptibility map according to the first embodiment.

FIG. 2 is a flowchart showing an example of a process procedure relating to the generation of a susceptibility map according to the present embodiment.

(Step Sa1)

The sequence control circuitry 121 scans the subject P in a three-dimensional manner in accordance with an imaging protocol of a multi-echo method having a gradient echo pulse sequence. Specifically, the sequence control circuitry 121 reads an imaging protocol having a gradient echo pulse sequence from the storage apparatus 129. Hereinafter, for brevity of description, there are four different echo times in the multi-echo method. The number of echo-times is not limited to four, and any natural number larger than one may be adopted. The sequence control circuitry 121 performs three-dimensional multi-echo imaging for the subject P by executing the read imaging protocol. The sequence control circuitry 121 collects three-dimensional MR data corresponding to each of the plurality of echo times TE.

(Step Sa2)

The processing circuitry 131 generates, by the image generation function 1313, a plurality of three-dimensional phase images (hereinafter, three-dimensional phase images) and a plurality of three-dimensional magnitude images (hereinafter, three-dimensional magnitude images) respectively corresponding to the plurality of echo times, using the collected three-dimensional MR data. Each voxel in the plurality of three-dimensional phase images is allocated with a phase value (spin phase information) of a range (hereinafter referred to as a phase range) of a $-\pi$ radian (rad) to $+\pi$ radian (rad). In other words, the phase value below $-\pi$ radian and the phase value over $+\pi$ radian are wrapped in its phase range when generating a three-dimensional phase image.

(Step Sa3)

The processing circuitry 131 generates, by the susceptibility map generation function 1315, a plurality of three-dimensional tissue phase images respectively corresponding to the plurality of echo times by high-quality processing for each of the plurality of three-dimensional phase images. The high-quality processing is, for example, phase-wrapping removal and background magnetic field (static magnetic field $B_0$) removal. Programs and mathematical expressions, etc. relating to the high-quality processing are stored in the storage apparatus 129.

Specifically, the processing circuitry 131 performs phase-wrapping removal on each three-dimensional phase image, using a publicly-known method used in the technical field of MRI and the technical field of SAR (Synthetic Aperture Radar), such as a region expansion method, a Laplacian method, and a graph cut method, and the like. On the three-dimensional phase image from which phase-wrapping has been removed, a phase originating in the susceptibility of the body tissues, and a phase originating in the influence of a background magnetic field are superimposed. The phase originating in the influence of the background magnetic field is larger than the phase originating in the susceptibility of the body tissue for about ten times or more.

In order to determine the susceptibility of the body tissue with good accuracy, the processing circuitry 131 performs, by the susceptibility map generation function 1315, processing of removing the phase originating in the influence of the background magnetic field from the three-dimensional phase image in which phase-wrapping has been removed, in other words, removal of influences of the background magnetic field. Specifically, the processing circuitry 131 uses various methods, such as a method of applying a filter, a SHARP (Sophisticated Harmonic Artifact Reduction on Phase data) method (includes improved SHARP method and RESHARP (Regularization-Enabled SHARP) method), or a PDF (Projection onto Dipole Field) method, to remove the influence of the background magnetic field in each of the plurality of three-dimensional phase images from which phase-wrapping has been removed. The processing circuitry 131 thereby generates the plurality of tissue phase images from which phase-wrapping and influence of the background magnetic field have been removed.

Figure 3:
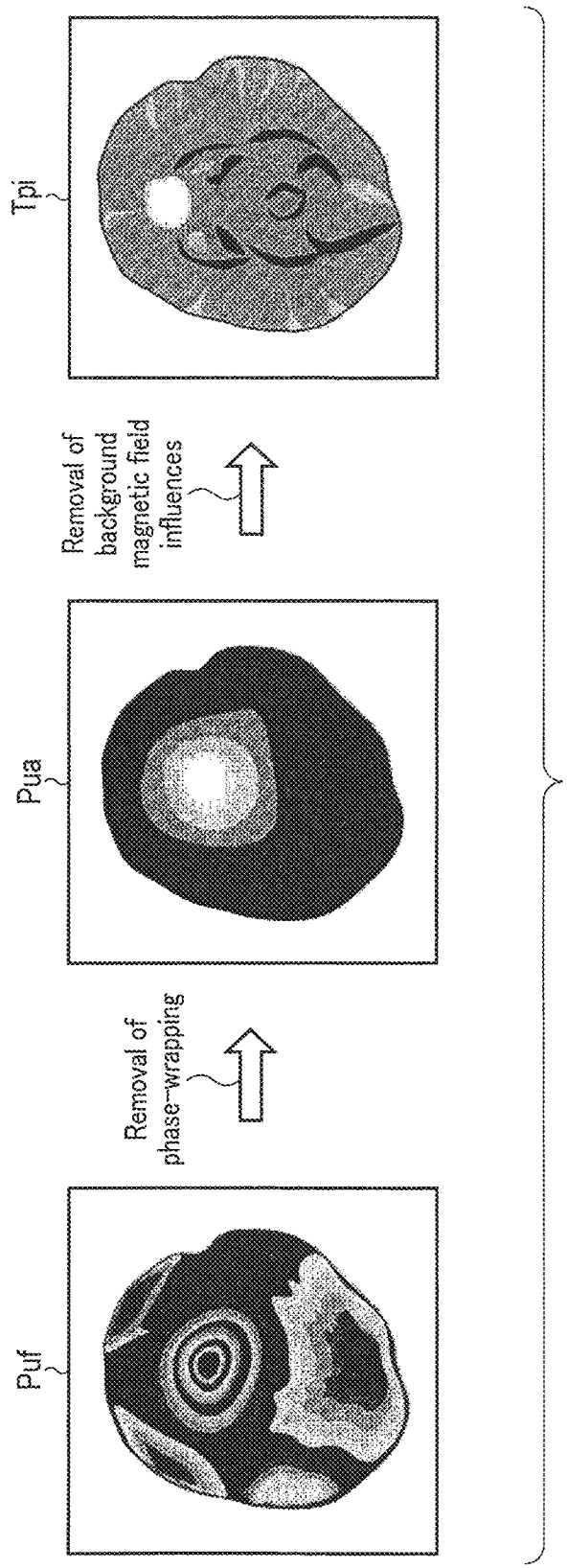
FIG. 3 is a diagram showing an example of a tissue phase image on which phase-wrapping removal and background magnetic field removal have been performed according to the first embodiment.

FIG. 3 is a diagram showing an example of the tissue phase image from which phase-wrapping and influence of the background magnetic field have been removed. The phase image Puf before performing the phase-wrapping removal in FIG. 3 illustrates a three-dimensional phase image generated by the image generation function 1313. The gradation of the image Puf indicates a phase value in the phase range of $-\pi$ radian to $+\pi$ radian. The gradation of the three-dimensional phase image Pua after the phase-wrapping removal in FIG. 3 indicates the phase value in the phase range of, for example, $-3\pi$ radian to $+3$ radian. The image Tpi after background magnetic field removal in FIG. 3 indicates a tissue phase image. The processing circuitry 131 generates, by the susceptibility map generating function 1315, a plurality of tissue phase images corresponding to a plurality of echo times.

(Step Sa4)

The processing circuitry 131 determines, by the susceptibility map generation function 1315, a local field map for each of the plurality of voxels of the same position in the plurality of tissue phase images, based on slope of a regression line relating to distribution of the phase values to the echo time (hereinafter referred to as a phase distribution). Specifically, the processing circuitry 131 performs fitting on the phase distribution for the plurality of voxels in the same position in the plurality of tissue phase images. The processing circuitry 131 determines, for every voxel, a regression parameter such as a result of regression analysis, for example, slope of the regression line in a phase distribution. The regression analysis is not limited to linear regression analysis conducted to determine a slope of a regression line; various complex regression analysis, for example, robust estimation, regularization regression, or nonlinear regression (machine learning such as support vector machine or random forest), can be used.

Figure 4:
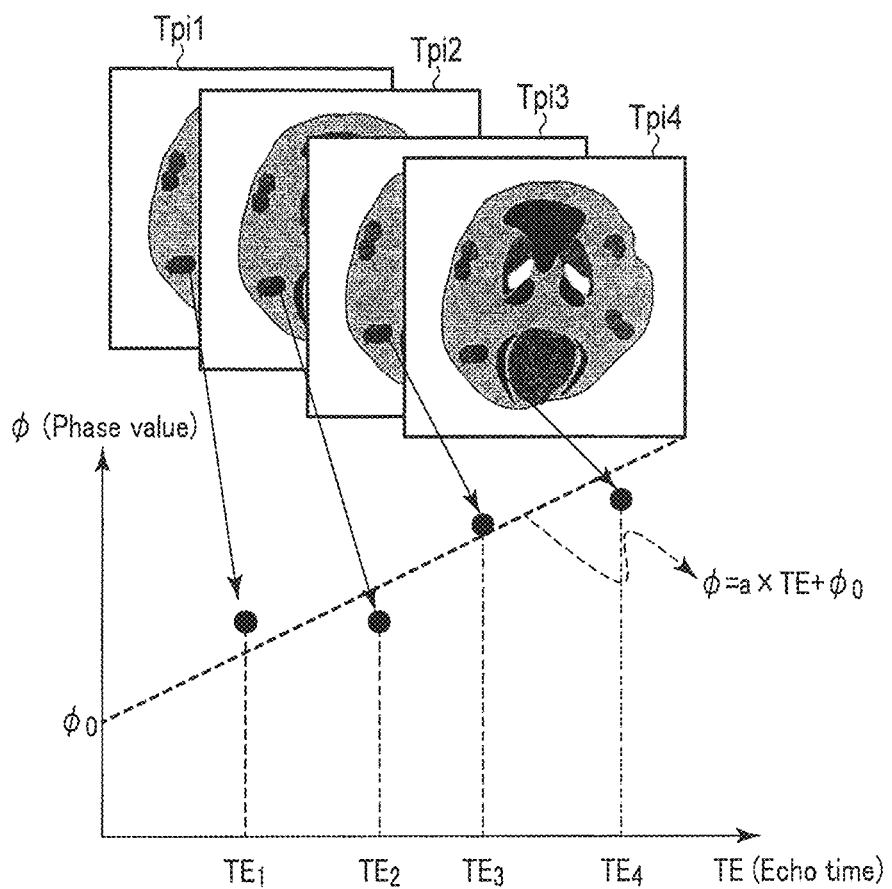
FIG. 4 is a diagram showing an example of fitting to a phase distribution for each voxel of a same position in a plurality of tissue phase images having different echo times according to the first embodiment.

FIG. 4 is a diagram showing an example of fitting to the phase distribution for the voxels of the same position in the plurality of tissue phase images having different echo times. The graph in FIG. 4 shows the phase distribution for the voxels in the same position and an example of fitting using a later-described equation (1) in a tissue phase image Tpi1 corresponding to echo time $TE_1$, a tissue phase image Tpi2 corresponding to echo time $TE_2$, a tissue phase image Tpi3 corresponding to echo time $TE_3$ and a tissue phase image Tpi4 corresponding to echo time $TE_4$.

As shown in FIG. 4, a regression line as a result of regression analysis can be expressed as follows, if "φ" represents a phase value, "a" represents slope, "TE" represents an echo time, and "$φ_0$" represents an intercept (initial phase value):

$$φ = a \times TE + φ_0 \quad (1)$$

By such fitting, the slope "a" (regression parameter) of the regression line in equation (1) is determined for each voxel.

The slope "a" can be represented as a product of a proton gyromagnetic ratio γ, a static magnetic field $B_0$, and a magnetic field distribution δ.

$$a = γ \times B_0 \times δ \quad (2)$$

The magnetic field distribution δ is also called a local field map and is equivalent to a relative magnetic field change caused by the difference in susceptibility among the body tissues. In other words, the magnetic field distribution δ is when the magnetic field generated by the susceptibility in each of the plurality of voxels of the tissue phase image indicates distribution of a magnetic field that affects each of the voxels in the tissue phase image. The processing circuitry 131 calculates the magnetic field distribution δ by dividing the determined slope with a product (Larmor frequency ω) of the gyromagnetic ratio γ and the static magnetic field B0.

(Step Sa5)

The processing circuitry 131 generates, by the susceptibility map generation function 1315, a relaxation time map of tissue in the imaging region, using the plurality of three-dimensional magnitude images, and generates an edge mask by performing edge detection on the generated relaxation time map. For a specific explanation, the relaxation time map of tissue will be hereinafter described as an $R_2^*$ map, in which $R_2^*$ as a reciprocal number of a $T_2^*$ value is arranged in each voxel in the imaging region. The relaxation time map of tissue is not limited to an $R_2^*$ map.

Specifically, the processing circuitry 131 performs fitting to the distribution of voxel values (magnitude signals) for an echo time TE with respect to the voxels of the same position in the plurality of three-dimensional magnitude images. By this fitting, the processing circuitry 131 calculates a $T_2^*$ value of each of the voxels in the imaging region. The processing circuitry 131 generates an $R_2^*$ map indicating distribution of the $R_2^*$ values in the imaging region by calculating a reciprocal number of the $T_2^*$ value for each voxel. In other words, the processing circuitry 131 performs fitting to distribution of the magnitude signals in the same position in the plurality of three-dimensional magnitude images to generate the relaxation time map (the $R_2^*$ map). For a specific explanation, suppose hereinafter that the imaging region is the brain of the subject's head. The imaging regions are however not limited to the head or brain.

Figures 5, 6:
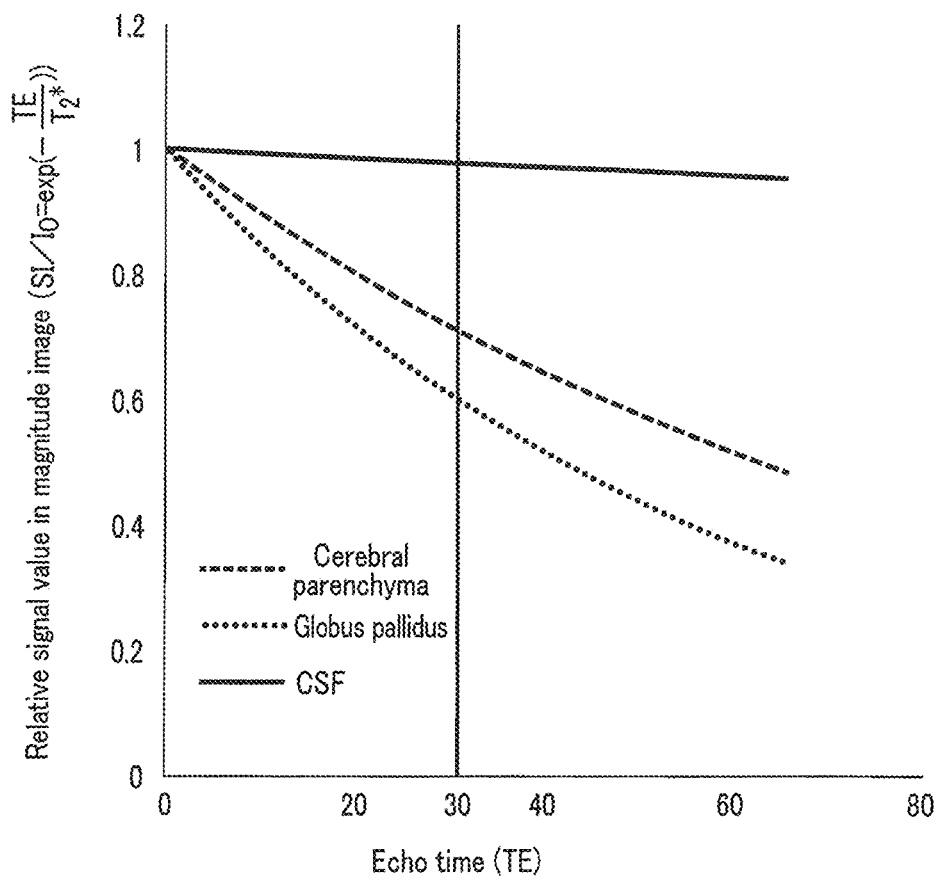
FIG. 5 is a diagram showing an example of changes in a relative signal value ($SI/I_0$) with respect to an echo time TE in a case where an imaging region is a brain in the first embodiment.
FIG. 6 is a diagram showing an example of a correspondence table of simulated values of a magnitude signal when the echo time TE is 30 and $T_2$ in literature values for the cerebral parenchyma, the globus pallidus, and a contrast difference therebetween in the first embodiment.

FIG. 5 is a diagram showing an example of changes in a relative signal value ($SI/I_0$) with respect to an echo time TE (hereinafter, signal transition) in a case where the imaging region is the brain. FIG. 6 is a diagram showing an example of a correspondence table of simulated values of a magnitude signal when the echo time TE is 30, and $T_2$ in literature values for the cerebral parenchyma, the globus pallidus, and a contrast difference therebetween. As shown in FIGS. 5 and 6, a $T_2^*$ value and a $T_2$ value are different from each other in, for example, the cerebral parenchyma, the globus pallidus, and the cerebrospinal fluid (CSF). In other words, the $T_2^*$ value and $T_2$ value are information of a relaxation time unique to tissue in the imaging region, and they are dependent on a magnitude of an absolute value of susceptibility, namely amounts of a ferromagnetic substance, a weak ferromagnetic substance, and a non-magnetic substance, etc. included in each voxel. The collection of MR signals associated with the generation of a susceptibility map is performed if echo times TE is in the range of 0 to 30. For this reason, as shown in FIGS. 5 and 6, the contrast of the $T_2^*$ value-based image (the $T_2^*$ map) is clearer than the contrast of the magnitude image. The $R_2^*$ map corresponds to a three-dimensional image in which the reciprocal numbers of the signal transition ($T_2^*$ values) shown in FIG. 5 as a contrast.

The processing circuitry 131 generates a three-dimensional map image by performing edge detection on the generated $R_2^*$ map. The generated mask image is a three-dimensional binary image (hereinafter, the edge mask $M_{R2}^*$) wherein the edge portion is 0 and the non-edge portion is 1 in the $R_2^*$ map. In other words, the edge mask $M_{R2}^*$ is a region divided using the relaxation time map. The generation of the edge mask $M_{R2}^*$ may be performed by the image generation function 1313. The processing in this step may be performed after step Sa2 or step Sa3. The processing circuitry 131 may generate the edge mask by performing edge detection to the $T_2^*$ map indicating the distribution of the $T_2^*$ values in the imaging region.

(Step Sa6)

The processing circuitry 131 calculates, by the susceptibility map generation function 1315, susceptibility for each voxel by optimization processing using the calculated susceptibility distribution δ and the edge mask $M_{R2}^*$, and generates a susceptibility map. Specifically, the processing circuitry 131 performs an optimization method in which L1 norm regularization is adopted, using the edge mask $M_{R2}^*$. The processing circuitry 131 reads from the storage apparatus 129 and executes a program, etc. related to the optimization method in which the L1 norm regularization is adopted to calculate susceptibility of each of the voxels. A procedure for calculating susceptibility from the magnetic field distribution δ and the edge mask $M_{R2}^*$ will be described below.

The magnetic field distribution δ is represented in the following by the convolutional integration (δ=d*χ) between dipole kernel d and the value of magnetic susceptibility χ.

$$δ = d * χ \quad (3)$$

When the Fourier transform F is executed to both sides of equation (3), equation (3) will become the following equation (4).

$$F[δ] = D \times F[χ] \quad (4)$$

D in equation (4) is the Fourier transform (D=F[d]) of d in the dipole kernel and is represented by the following:

$$D = 1/3 - k_z^2/(k_x^2 + k_y^2 + k_z^2) \quad (5)$$

In equation (5), $D^{-1}$, which is the reciprocal number of D, becomes zero when $k_z^2/(k_x^2+k_y^2+k_z^2)=1/3$. Therefore, the method of calculating F[χ] by multiplying the reciprocal $D^{-1}$ of D from the left-hand side to both sides of equation (4) will be an ill-posed problem.

The processing circuitry 131 uses L1 norm regularization using the edge mask $M_{R2}^*$ to solve the above ill-posed problem. First, when an inverse Fourier transform is executed to both sides of equation (4), the following equation (6) is obtained:

$$δ = F^-[D \times F[χ]] \quad (6)$$

The first evaluation function $f_1(\chi)$ for estimating the susceptibility in the present embodiment is, for example, set as shown in the following equation (7) by using the left-hand side $(\delta - F^{-1}[D \times F[\chi]])$ when the right-hand side of equation (6) is shifted to the left-hand side and using a regularization term related to the spatial smoothness of the susceptibility in the non-edge portion of the $R_2^*$ map.

$$f_1(\chi) = \|\delta - F^{-1}[D \times F[\chi]]\|_2^2 + \lambda_1 \|M_{R2^*} \nabla \chi\|_1 \quad (7)$$

The first term of the right-hand side in equation (7) is a secondary norm squared indicating the degree of match of equation (6). The $M_{R2^*} \nabla \chi$ in the second term of the right-hand side in equation (7) indicates a spatial gradient (hereinafter, non-edge gradient) of the susceptibility $\chi$ in the non-edge portion of the $R_2^*$ map. In equation (7), $M_{R2^*}|\nabla \chi|$, which is the absolute value of the spatial gradient of the susceptibility x in the non-edge portion of the $R_2^*$ map, may be used instead of the non-edge gradient $M_{R2^*} \nabla \chi$. In addition, the $\lambda_1$ in the second term of the right-hand side of equation (7) is a regularization parameter used in non-edge gradient-based regularization.

The processing circuitry 131 calculates, by the susceptibility map generation function 1315, susceptibility for each voxel by first optimization processing for minimizing the right-hand side of equation (7). The first optimization processing is expressed as the following equation (8):

$$\chi = \mathrm{argmin}_\chi(f_1(\chi)) = \mathrm{argmin}\{\|\delta - F^{-1}[D \times F[\chi]]\|_2^2 + \lambda_1 \|M_{R2^*} \nabla \chi\|_1\} \quad (8)$$

Equation (8) indicates that susceptibility in the imaging region is determined in such a manner that the distribution of susceptibility in the imaging region forms magnetic field distribution $\delta$ and the non-edge gradient becomes minimum. To minimize the non-edge gradient is equivalent to smoothing the susceptibility in the non-edge portion in the relaxation time map.

As a method of stably obtaining approximate susceptibility in equation (8), the processing circuitry 131 calculates the susceptibility value in each of the plurality of positions in the imaging region by applying various optimization processes of, for example, Newton's method, steepest descent method, conjugate gradient method, nonlinear conjugate gradient method, penalty method, or ADMM (Alternating Direction Method of Multipliers), etc., to equation (8). The processing circuitry 131 calculates the difference of the susceptibility (offset) in the reference point in the imaging region from the susceptibility of each of the positions. The reference point corresponds to a region where the susceptibility is in the vicinity of zero and water is dominant. For example, if the brain is the imaging region, the reference point is a region where CSF is present.

Figure 7:
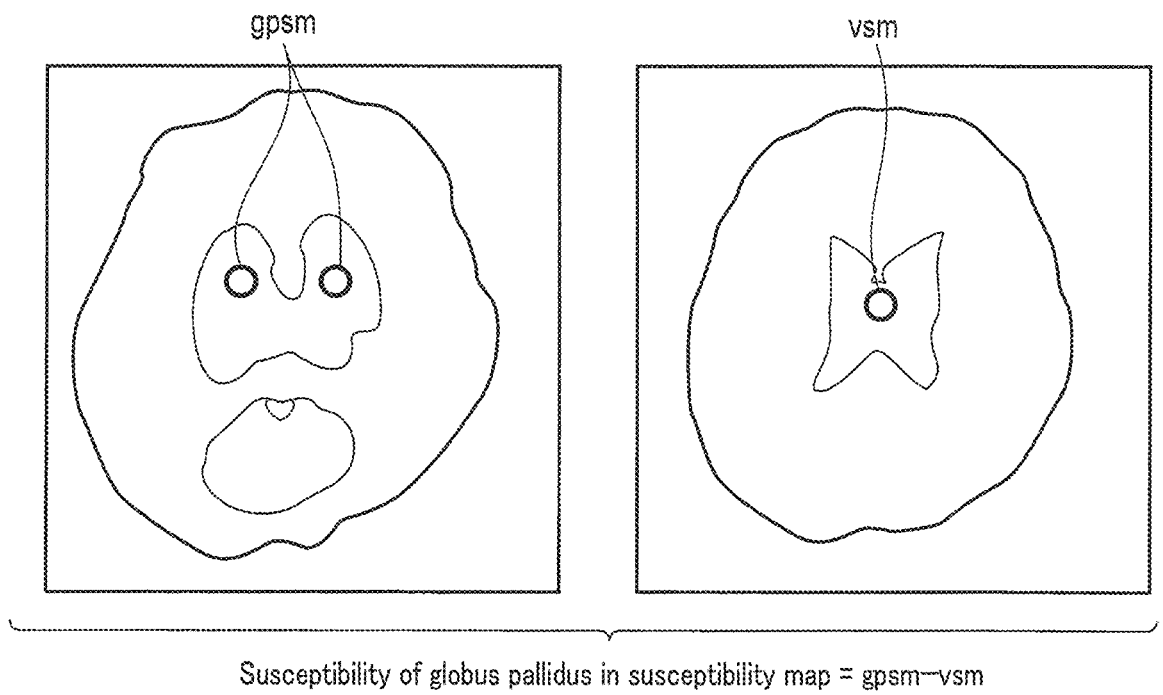
FIG. 7 is a drawing showing an example of a reference point (cerebral ventricles) and an observation region (globus pallidus) in the first embodiment.

FIG. 7 is a drawing showing an example of a reference point (cerebral ventricles) and an observation region (globus pallidus) in the present embodiment. As shown in FIG. 7, the susceptibility of the globus pallidus, which is the observation region in the susceptibility map, is determined by calculating a difference of the susceptibility vsm of the cerebral ventricles as calculated using equation (8) from the susceptibility gpsm of the globus pallidus as calculated using equation (8).

The processing circuitry 131 generates quantitative susceptibility mapping (QSM) by mapping the difference on a corresponding pixel. In other words, in this step, the processing circuitry 131 generates a susceptibility map by the optimization processing with a regularization term using the edge mask for smoothing the susceptibility within the non-edge portion in the relaxation time map. In other words, the processing circuitry 131 suppresses a gradient or an absolute value of a gradient of the susceptibility relating to a region divided using the relaxation time map (an edge mask), and generates the susceptibility map.

The processing circuitry 131 may generate a susceptibility map by mapping the calculated susceptibility on a corresponding pixel. The processing circuitry 131 may also generate, by the image generation function 1313, a new image by multiplying or subtracting the pixel value or the like in the magnitude image by, or from, the pixel image of the tissue phase image or susceptibility value of the susceptibility map. The processing circuitry 131 may colorize the susceptibility map and generate an image superimposed on the gray scale magnitude image (susceptibility superimposed image). The processing circuitry 131 outputs the generated susceptibility map and susceptibility-superimposed image, etc. to the display 127. The display 127 displays the susceptibility map and susceptibility-superimposed image, etc.

According to the above-described configuration, the following advantageous effects can be obtained.

According to the MRI apparatus 100 of the present embodiment, it is possible to generate a relaxation time map of tissue based on a plurality of magnitude images corresponding to a plurality of echo times, and to generate a susceptibility map that quantitatively indicates susceptibility values in a subject, based on the relaxation time map and magnetic field distribution generated by a plurality of phase images corresponding to the plurality of echo times. In more detail, according to the present MRI apparatus 100, it is possible to generate a relaxation time map by performing fitting to distribution of magnitude signals in the same position in a plurality of magnitude images, to generate an edge mask by performing edge detection to the generated realization time map, and to generate a susceptibility map by performing optimization processing with a regularization term, using the generated edge mask for smoothing susceptibility in a non-edge portion in the relaxation time map. For example, according to the MRI apparatus 100, it is possible to suppress a gradient or an absolute value of the gradient of susceptibility relating to a region divided using a relaxation time map, and to generate a susceptibility map.

In other words, according to the present MRI apparatus 100, it is possible to generate an edge mask $M_{R2^*}$ using an $R_2^*$ map based on a map ($T_2^*$ map) indicating a realization time of various tissue included in an imaging region (a quantitative value of each tissue), and to calculate susceptibility using a first evaluation function $f_1(\chi)$ having L1 norm regularization using the edge mask $M_{R2}^*$. With the optimization method in the present embodiment, it is thereby possible to generate a susceptibility map in which susceptibility in a high-susceptibility region is improved by suppressing smoothing of susceptibility in a tissue boundary corresponding to an edge in the susceptibility map (an edge portion in a $R_2^*$ map), and by smoothing susceptibility in a non-tissue boundary (a non-edge portion in the $R_2^*$ map). In other words, according to the present MRI apparatus 100, it is possible to generate a high-precision susceptibility map by reducing a shading artifact due to a partial volume effect in a tissue boundary in a susceptibility map, and by smoothing susceptibility inside tissue in the susceptibility map.

Figure 8:
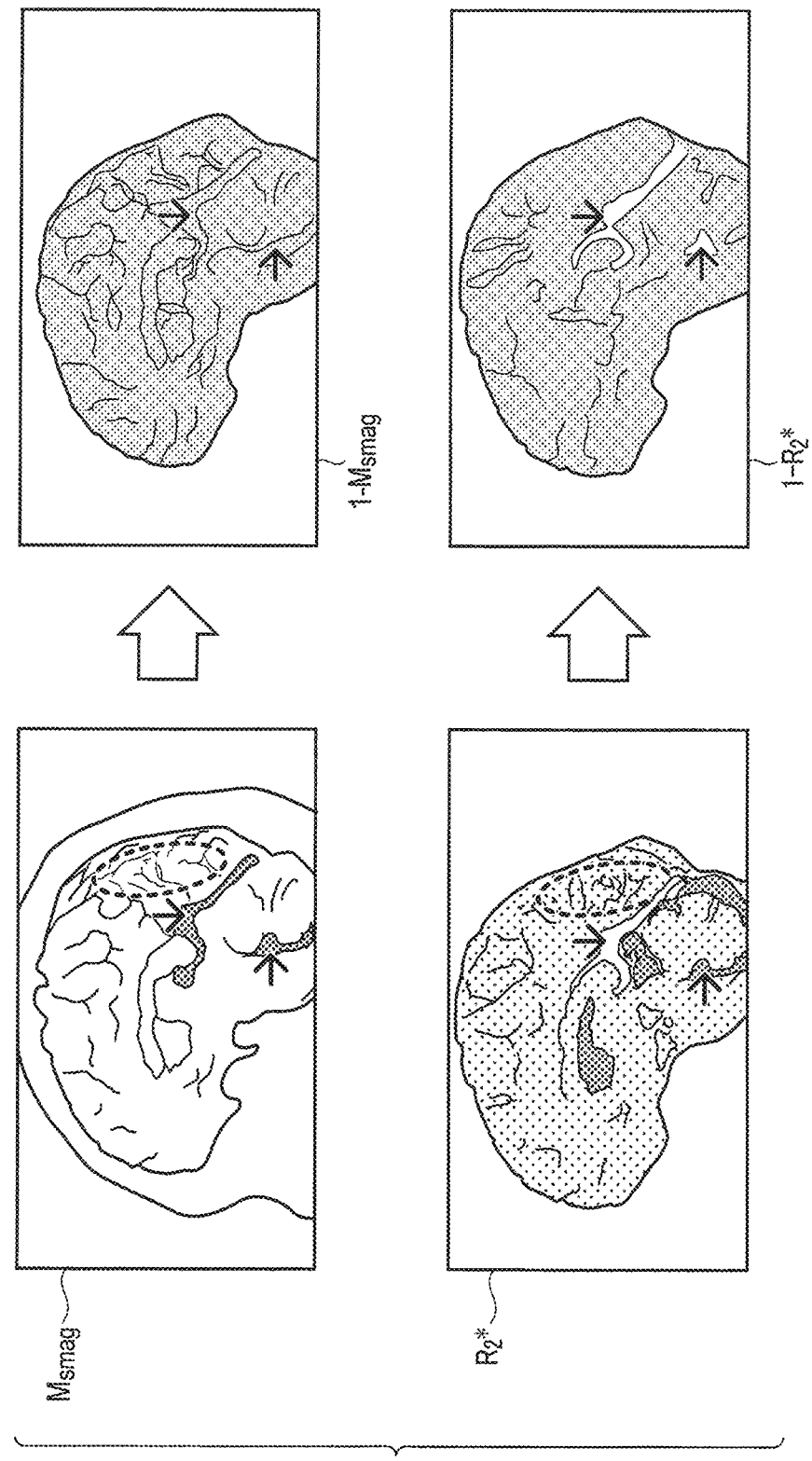
FIG. 8 is a drawing showing examples of a magnitude image ($M_{smag}$) and an $R_2^*$ map ($R_2^*$), and a difference between the reference value of 1 and the magnitude image ($M_{smag}$) and a difference between the reference value of 1 and the $R_2^*$ map ($R_2^*$) in a sagittal plane when an imaging region is the brain in the first embodiment.
Figures 9, 10:
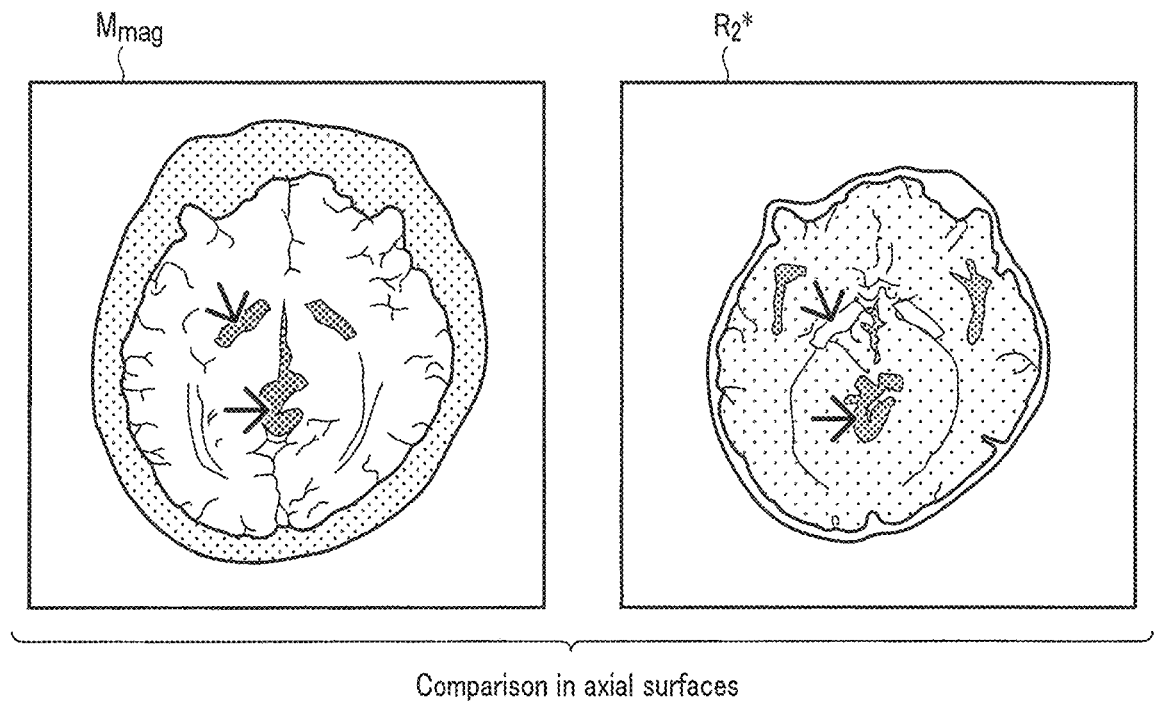
FIG. 9 is a drawing showing examples of a magnitude image and an $R_2^*$ map in an axial plane when the imaging region is the brain in the first embodiment.
FIG. 10 is a table showing examples of tissues and substances related to the contrast in each of a susceptibility map, a magnitude image ($T_2^*$ enhanced image), and a relaxation time map ($T_2^*$ map).

FIG. 8 is a drawing showing examples of a magnitude image ($M_{smag}$) and an $R_2^*$ map ($R_2^*$), and a difference between the reference value of 1 and the magnitude image ($M_{smag}$) and a difference between the reference value of 1 and the $R_2^*$ map ($R_2^*$) in a sagittal plane when an imaging region is the brain. FIG. 9 is a drawing showing examples of a magnitude image and an $R_2^*$ map in an axial plane when an imaging region is the brain. FIG. 10 is a drawing showing examples of tissues and substances related to the contrast in each of a susceptibility map, a magnitude image ($T_2^*$ enhanced image), and a relaxation time map ($T_2^*$ map) in the present embodiment.

As indicated by the arrows in FIGS. 8 and 9, a contrast among CSF having positive susceptibility in the vicinity of zero, Fe having positive susceptibility larger than that of CSF (mainly, lumen of blood vessels), and myelin having negative susceptibility is clearer in the $R_2^*$ map than in the magnitude image. In other words, as shown in FIGS. 8 and 9, the contrast in the $R_2^*$ map is more improved than the contrast in the magnitude image. Furthermore, as shown in FIG. 10, in the contrast in the relaxation time map ($T_2^*$ map), CSF (non-ferromagnetic substance), cerebral parenchyma (weak ferromagnetic substance), calcium components (calcified substance), and iron components (e.g., reduced hemoglobin and ferritin) (ferromagnetic substance) are separated depending on magnitude of susceptibility. For this reason, according to the susceptibility map generation function 1315 of the present embodiment, since an edge mask $M_{R2}^*$ in which the precision is improved compared to the edge in the magnitude image is used for L1 norm regularization, a high-precision susceptibility map, in which susceptibility is improved by separating substances of a living body, such as CSF (non-ferromagnetic substance), calcium components (negative susceptibility), and iron components (positive susceptibility), as contrasts, and suppressing smoothing in a tissue boundary, can be generated.

In the region surrounded by the broken line in the magnitude image shown in FIG. 8, a shading artifact appears. In the region surrounded by the broken line in the $R_2^*$ map in FIG. 8 on the other hand, the shading artifact is reduced. Thus, according to the susceptibility map generation function 1315 in the present embodiment, a high-precision susceptibility map in which an influence of partial volume effect corresponding to a low-reliable region in the magnitude image, can be generated.

As described in the forgoing, according to the MRI apparatus 100 of the present embodiment, in the calculation of susceptibility in the susceptibility map generation function 1315, it is possible to prevent a decrease in susceptibility in a tissue boundary due to regularization and to reduce shading artifacts, thereby generating a high-precision susceptibility map in which the precision of susceptibility is improved. Therefore, according to the present embodiment, if, for example, the imaging region is the brain, without decreasing the susceptibility in the globus pallidus which is a high-susceptibility region, it is possible to generate a high-precision susceptibility map and to improve efficiency in diagnosis for, for example, Alzheimer's and multiple sclerosis. In other words, substances in a subject can be separated into contrasts and a tissue boundary can be prevented from being smoothed out in a susceptibility map generated by the various processing according to the present embodiment, and the map is displayed with a reduced influence of a partial volume effect, thereby improving diagnostic efficiency.

Second Embodiment

Some of the differences from the first embodiment are to specify a region associated with a shading artifact using a simultaneous time map of tissue, etc., and to generate a susceptibility map in which a shading artifact is reduced in the specified region (hereinafter, a high-precision susceptibility map).

FIG. 11 is a diagram showing a configuration of the MRI apparatus 100 in the present embodiment. A difference from FIG. 1 is that the processing circuitry 131 according to the present embodiment additionally has a region specifying function 1317. In the following, for a specific description, the imaging region will be a head, similarly to the first embodiment. The processing related to the region specifying function 1317 and the susceptibility map generation function 1315 will be described in detail in the description of the operation of the present embodiment. The region specifying unit 1317 of the processing circuitry 131 is an example of a region specifying unit.

The storage apparatus 129 stores various programs executed in the susceptibility map generation function 1315 and the region specifying function 1317, a plurality of thresholds used in the region specifying function 1317, and various images generated by the susceptibility map generation function 1315 and the region specifying function 1317. The storage apparatus 129 stores a susceptibility map generated in the processing in step Sa6 shown in FIG. 2 (hereinafter, the first susceptibility map). Hereinafter, the susceptibility in each of the pixels in the first susceptibility map will be referred to as first susceptibility $\chi_1$.

Figure 12:
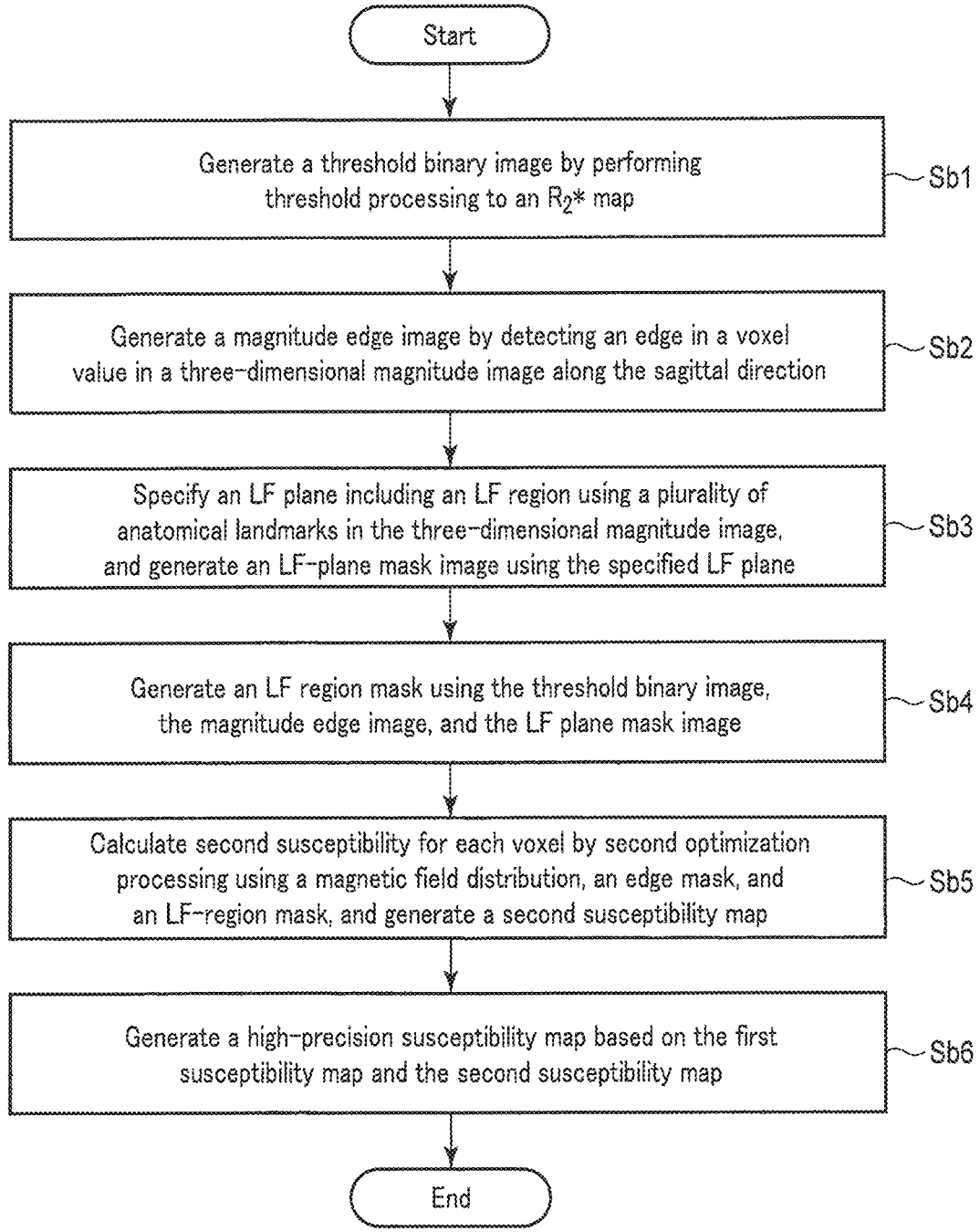
FIG. 12 is a flowchart showing an example of a process procedure relating to generation of a high-precision susceptibility map according to the second embodiment.

FIG. 12 is a flowchart showing an example of a process procedure relating to the generation high-precision susceptibility map according to the present embodiment.

(Step Sb1)

The processing circuitry 131 generates, by the region specifying function 1317, a three-dimensional threshold binary image by performing threshold processing to an $R_2^*$ map. Specifically, the processing circuitry 131 reads from the storage apparatus 129 a first threshold and a second threshold to be compared with an $R_2^*$ value. The first and second thresholds are thresholds for extracting tissue associated with a partial volume, which causes shading artifacts. An area where a partial volume is caused in the susceptibility map of a head is, for example, a longitudinal fissure (LF) region. An LF region has a boundary between tissue (cerebral parenchyma) and CSF. Accordingly, the first and second thresholds correspond to quantitative values respectively corresponding to the lower limit and the upper limit of the $R_2^*$ value of the cerebral parenchyma, and are preset as thresholds for specifying the cerebral parenchyma in the $R_2^*$ map. The first threshold is 10 [1/s] for example. The second threshold is 40 [1/s] for example. Those values of the first and second thresholds are merely examples, and are not limited thereto. In other words, in the tissue included in the imaging region, the first and second thresholds may be set based on a $T_2$ value of the tissue associated with a partial volume.

The processing circuitry 131 performs, by the region specifying function 1317, threshold processing to the $R_2^*$ map, using the first and second thresholds. In other words, the processing circuitry 131 compares each of a plurality of $R_2^*$ values in the $R_2^*$ map with the first threshold and the second threshold. By this comparison, the processing circuitry 131 allocates 0 to an $R_2^*$ value less than the first threshold. In addition, the processing circuitry 131 allocates 0 to an $R_2^*$ value greater than the second threshold. Furthermore, the processing circuitry 131 allocates 1 to an $R_2^*$ value greater than the first threshold and less than the second threshold. The processing circuitry 131 generates a binary image (threshold binary image Th($R_2^*$) as a result of the above threshold processing. If the first threshold and the second threshold are defined as aforementioned, the threshold binary image Th($R_2^*$) corresponds to a binary image indicating presence/absence of the cerebral parenchyma (gray matter and white matter) in the imaging region. The processing circuitry 131 causes the storage apparatus 129 to store the threshold binary image Th($R_2^*$). The threshold binary image Th($R_2^*$) may be used instead of an edge mask $M_{R2}^*$ in a first evaluation function in the first embodiment.

(Step Sb2)

Figure 13:
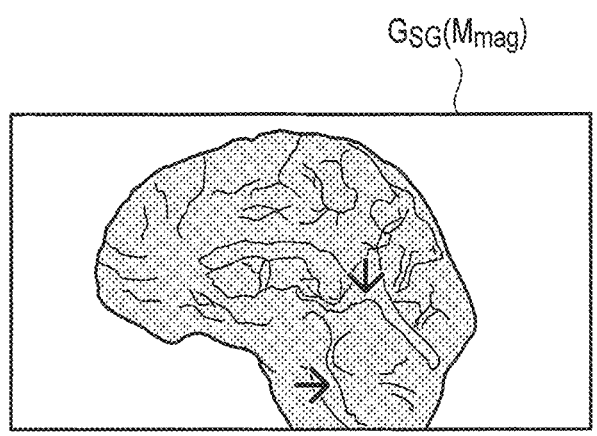
FIG. 13 is a drawing showing an example of a magnitude edge image $G_{SG}$ ($M_{mag}$) in a sagittal plane in which an edge is detected in the second embodiment.

The processing circuitry 131 detects, by the region specifying function 1317, an edge of a voxel value along the sagittal direction in the three-dimensional magnitude image to generate a three-dimensional magnitude edge image. The edge detection of a voxel value along the sagittal direction in the three-dimensional magnitude image is equivalent to detecting a region that includes a portion where a partial volume is caused in the imaging region. Specifically, the processing circuitry 131 allocates 1 to a voxel where an edge is detected, and 0 to a voxel where an edge is not detected, and a three-dimensional magnitude edge image $G_{SG}(M_{mag})$ in which the edges are expressed by binarization. FIG. 13 is a drawing showing an example of a magnitude edge image $G_{SG}(M_{mag})$ in a sagittal plane in which an edge is detected. The processing circuitry 131 causes the storage apparatus 129 to store the three-dimensional magnitude edge image $G_{SG}(M_{mag})$. The edge detection relating to the generation of the magnitude edge image $G_{SG}(M_{mag})$ is not limited to the detection along the sagittal direction, and can be set as appropriate in accordance with tissue associated with a partial volume.

(Step Sb3)

The processing circuitry 131 specifies, by the region specifying function 1317, a plane including an LF region (hereinafter, the LF plane) using a plurality of anatomical landmarks in the three-dimensional magnitude image, and generates a three-dimensional LF plane mask image $M_{LFP}$ wherein 1 is allocated to the LF plane and 0 is allocated to the non-LF plane, using the specified LF plane.

Specifically, the processing circuitry 131 detects, by the region specifying function 1317, the plurality of anatomical landmarks by applying the three-dimensional magnitude image to machine learning based on a region detection method using dictionary data. Machine learning based on a region detection method is, for example, region extraction processing that involves segmentation using random forest. The machine learning is learning in advance through training data, in accordance with an imaging region and an imaging target site, etc. The detection of anatomical landmarks is not limited to machine learning, and may be a region detection method selected as appropriate, such as deep learning.

The plurality of anatomical landmarks are, for example, if the imaging region is a head, straight sinus (SS), anterior cranial fossa (ACF), frontal superior sagittal sinus (FSSS), parietal superior sagittal sinus (PSSS), and occipital superior sagittal sinus (OSSS).

Figure 14:
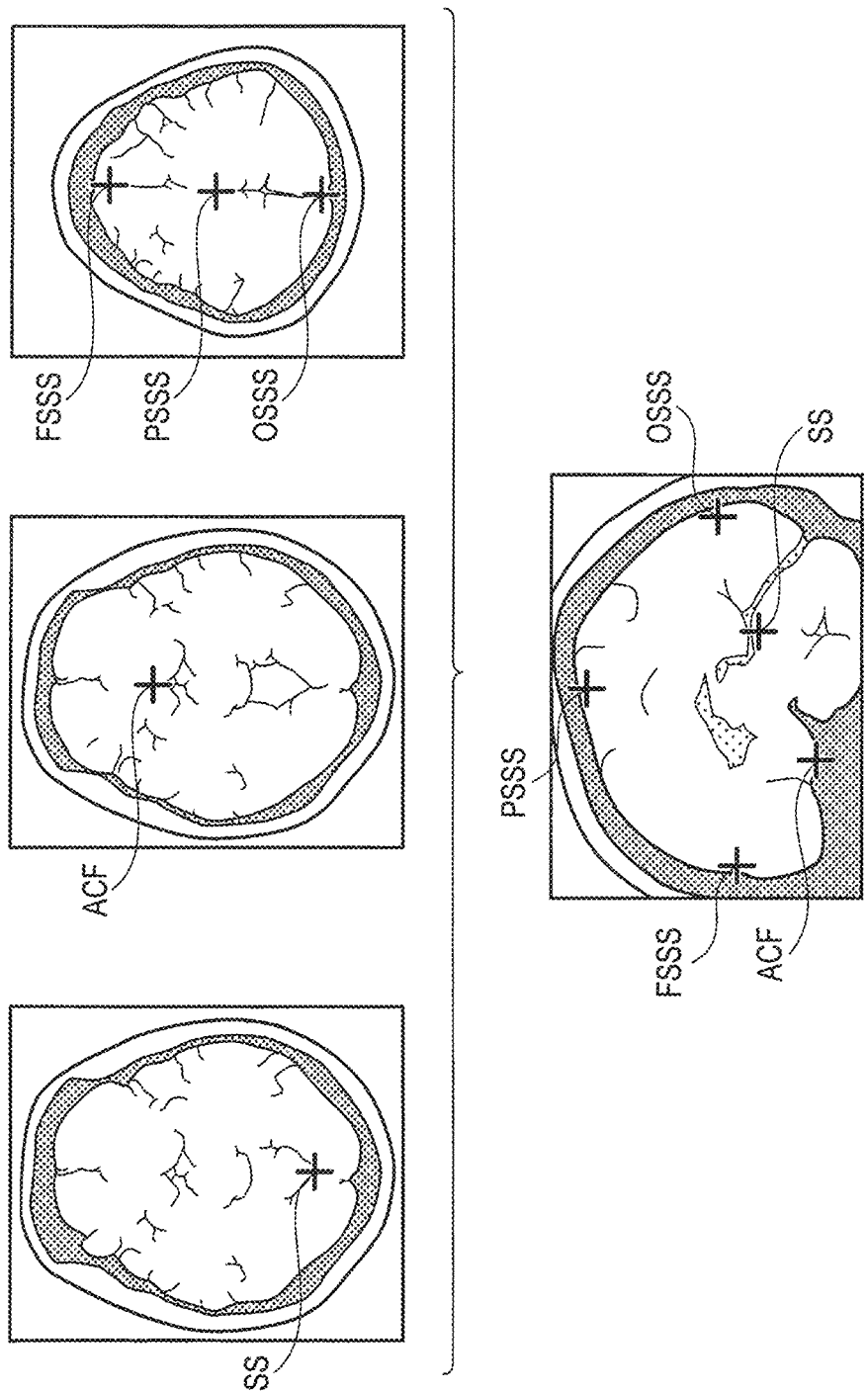
FIG. 14 is a drawing showing examples of three-dimensional positions of five anatomical landmarks (straight sinus, anterior cranial fossa, superior longitudinal sinus in a parietal region, superior longitudinal sinus in a frontal region, and superior longitudinal sinus in an occipital region) in the second embodiment.

FIG. 14 is a drawing showing examples of three-dimensional positions of the aforementioned five anatomical landmarks (SS, ACF, FSSS, PSSS, and OSSS). The anatomical landmarks are not limited to the above-listed five points. The anatomical landmarks may be three points that are not in alignment, for example.

The processing circuitry 131 specifies, by the area specifying function 1317, the LF plane including the LF region by performing regression analysis to the detected plurality of anatomical landmarks. The regression analysis is for example linear regression analysis. The regression analysis is not limited to linear regression analysis, for example, robust estimation or regularization regression, nonlinear regression (machine learning such as support vector machine or random forest), and various complex regression analyses can be used. The processing circuitry 131 allocates 1 to the inside of the specified LF plane, and allocates 0 to the outside of the LF plane, and thereby generates a three-dimensional binary image (an LF plane mask image $M_{LFP}$). The processing circuitry 131 causes the storage apparatus 129 to store the LF plane mask image $M_{LFP}$.

Figure 15:
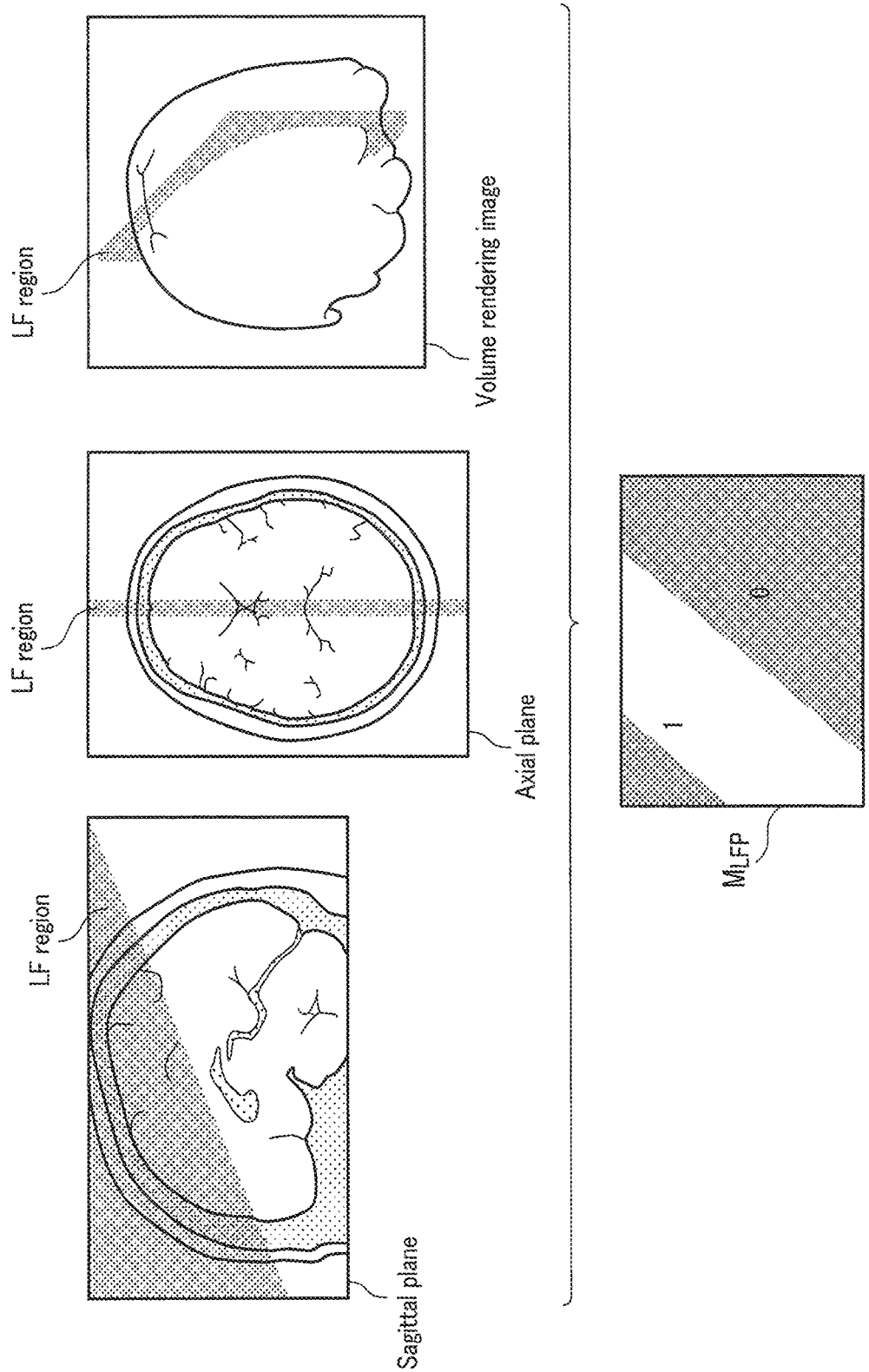
FIG. 15 is a drawing showing an LF region in each of an axial plane, a sagittal plane, and a volume rendering image, and an LF-plane mask image $M_{LFP}$ in a sagittal plane in the second embodiment.

The LF plane mask image $M_{LFP}$ is an image indicating presence/absence of an LF plane in an imaging region. FIG. 15 is a drawing showing an LF region in each of an axial plane, a sagittal plane, and a volume rendering image, and an LF-plane mask image $M_{LFP}$ in a sagittal plane. In FIG. 15, the LF plane in each of the sagittal plane, the axial plane, and the volume rendering image corresponds to the hatched portions. As shown in FIG. 15, the LF plane mask image $M_{LFP}$ is a binary image wherein the LF plane is defined as 1 and the non-LF plane is defined as 0. By indirectly using the LF plane mask image $M_{LFP}$ in the calculation of susceptibility, it is possible to suppress influences due to susceptibility of other regions, such as basal ganglia and optic radiation, that affects the susceptibility of the LF region. The above processing in this step is described using the LF region as an example; however, similar processing can be performed for various tissues relating to a partial volume.

(Step Sb4)

The processing circuitry 131 integrates, by the region specifying function 1317, the threshold binary image Th($R_2^*$), the magnitude edge image $G_{SG}(M_{mag})$, and the LF plane mask image $M_{LFP}$, and thereby generates a three-dimensional LF region in which presence/absence of an LF region is expressed in a binary manner. The LF region mask $M_{LF}$ is calculated by the following equation (9):

$$M_{LF}=Th(R_2^*) \times G_{SG}(M_{mag}) \times M_{LFP} \quad (9)$$

In equation (9), a product of the threshold binary image Th($R_2^*$) and the magnitude edge image $G_{SG}(M_{mag})$ corresponds to a portion where the cerebral parenchyma exists and a partial volume occurs. As shown in equation (9), the LF region mask $M_{LF}$ is a three-dimensional binary image. The value "1" in the LF region mask $M_{LF}$ indicates an LF region. The value "0" in the LF region mask $M_{LF}$ indicates a non-LF region.

Figure 16:
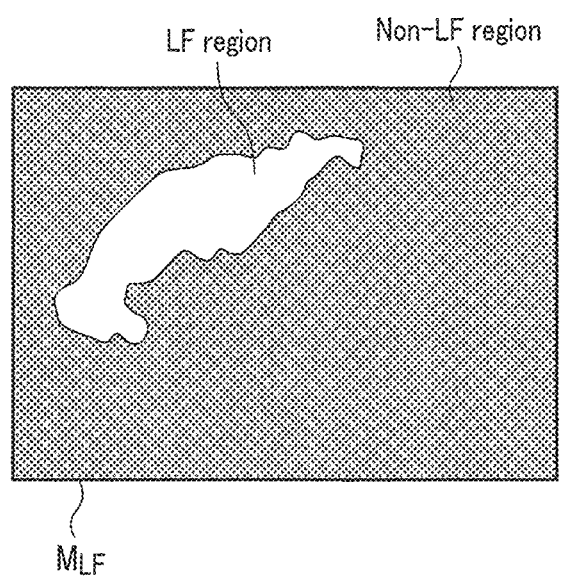
FIG. 16 is a drawing showing an example of an LF-plane region image $M_{LF}$ in a sagittal plane in the second embodiment.

The processing circuitry 131 causes the storage apparatus 129 to store the generated LF region mask $M_{LF}$. FIG. 16 is a drawing showing an example of an LF-plane region image $M_{LF}$ in a sagittal plane. As shown in FIG. 16, the LF plane mask $M_{LF}$ is a binary image wherein the LF plane is defined as 1 and the non-LF plane is defined as 0. By the processing in step Sb1 through the processing in step Sb4, the processing circuitry 131 specifies, by the region specifying function 1317, a region related to occurrence of a partial volume in an imaging region based on the relaxation time map, the magnitude image, and the plurality of anatomical landmarks in the magnitude image.

(Step Sb5)

The processing circuitry 131 calculates, by the susceptibility map generation function 1315, susceptibility (hereinafter, second susceptibility) for each voxel by second optimization processing using the susceptibility distribution δ, the edge mask $M_{R2}^*$, and the LF region mask $M_{LF}$, and generates a second susceptibility map. Specifically, the processing circuitry 131 performs an optimization method in which L1 norm regularization using the edge mask $M_{R2^*}$ and L2 norm regularization using the LF region mask $M_{LF}$ are adopted. The processing circuitry 131 reads from the storage apparatus 129 and executes a program, etc. related to the optimization method in which L1 norm regularization and L2 norm regularization are adopted to calculate second susceptibility of each of the voxels. A procedure for calculating second susceptibility $\chi_2$ from the magnetic field distribution $\delta$, the edge mask $M_{R2}*$, and the LF region mask $M_{LF}$ will be described below.

The second evaluation function for estimating the second susceptibility $\chi_2$, that is $f_2(\chi_2)$, can be set as shown in equation (10) below, using the left-hand side when the right-hand side of equation (6) is moved to the left-hand side, ($\delta - F^{-1}[D \times F[\chi_2]]$), and the L2 norm regularization term (the second regularization term) that suppresses shading artifacts in the LF region:

$$f_2(\chi_2) = \|\delta - F^{-1}[D \times F[\chi_2]]\|_2^2 + \lambda_1 \|M_{R2}*\nabla\chi_2\|_1 + \lambda_2 \|M_{LF}(\chi_2 - \chi_{LFAV})\|_2^2 \quad (10)$$

The value $\chi_{LFAV}$ in equation (10) indicates an average of the second susceptibility in the LF region (hereinafter, LF average susceptibility). The value $M_{LF}(\chi_2 - \chi_{LFAV})$ in the L2 norm regularization term ($\lambda_2 \|M_{LF}(\chi_2 - \chi_{LFAV})\|_2^2$) indicates a difference between second susceptibility and LF average susceptibility in the LF region (hereinafter, an LF susceptibility difference). $\chi_2$ is a parameter relating to regularization based on the LF susceptibility difference in the LF region. In the second evaluation function $f_2(\chi_2)$, the threshold binary image $Th(R_2*)$ may be used instead of the edge mask $M_{R2}*$.

The processing circuitry 131 calculates, by the susceptibility map generation function 1315, second susceptibility $\chi_2$ for each voxel by second optimization processing for minimizing the right-hand side of equation (10). The second optimization processing is expressed as the following equation (11):

$$\chi_2 = \mathrm{argmin}_{\chi_2}(f_2(\chi_2)) = \\ \mathrm{argmin}\{\|\delta - F^{-1}[D \times F[\chi_2]]\|_2^2 + \lambda_1\|M_{R2}*\nabla\chi_2\|_1 + \\ \lambda_2\|M_{LF}(\chi_2 - \chi_{LFAV})\|_2^2\} \quad (11)$$

Equation (11) indicates that second susceptibility $\chi_2$ in the imaging region is determined in such a manner that the distribution of the second susceptibility $\chi_2$ in the imaging region forms magnetic field distribution $\delta$ and the non-edge gradient and the LF susceptibility difference become minimum. By the L2 norm regularization term $\lambda_2\|M_{LF}(\chi_2 - \chi_{LFAV})\|_2^2$, the susceptibility in the LF region is suppressed to the vicinity of the LF average susceptibility. In other words, the processing circuitry 131 generates, by the susceptibility map generation function 1315, second susceptibility by the second optimization processing with the second regularization term that suppresses, by using the edge mask, the susceptibility in the specified region (LF region) to average susceptibility (LF average susceptibility) in the LF region.

As a method of stably obtaining approximate second susceptibility $\chi_2$ in equation (11), the processing circuitry 131 calculates the second susceptibility $\chi_2$ in each of the plurality of positions in the imaging region by applying various optimization processes of, for example, Newton's method, steepest descent method, conjugate gradient method, nonlinear conjugate gradient method, penalty method, or ADMM (Alternating Direction Method of Multipliers), etc., to equation (11). The processing circuitry 131 causes the storage apparatus 129 to store the second susceptibility map in which the calculated second susceptibility $\chi_2$ is arranged across the imaging region.

Hereinafter, features of the second susceptibility $\chi_2$ generated by the second optimization processing will be described. Generally, partial volume effect causes degradation of contrast in an MR image. For example, in an LF region in a susceptibility map of the brain, the susceptibility associated with a shading artifact is of a negative value, and the LF region would be displayed as a darker, sunken area in the periphery of the LF region. Specifically, the susceptibility of a region corresponding to CSF in the LF region may be of a negative value, which is physically impossible, regardless of its positive susceptibility value in the vicinity of zero, because of the influence of the partial volume effect. In contrast, the second susceptibility $\chi_2$ generated by the second optimization processing is regularized so that the LF susceptibility difference becomes minimum, as shown in equation (11). For this reason, the second susceptibility $\chi_2$ in the region related to shading artifact becomes a value in the vicinity of the LF average susceptibility in the LF region in the second susceptibility map. Thus, it is possible to suppress generation of a dark sunken area in the LF region in the second susceptibility map.

On the other hand, if there is a region having a positive ferromagnetic substance (i.e., iron), such as blood vessel lumen, in the susceptibility map, the susceptibility in such a region is of a large positive value. For this reason, the region such as a blood vessel lumen in the susceptibility map shows high contrast compared to the surrounding regions, and is displayed in white. In contrast, the second susceptibility $\chi_2$ generated by the second optimization processing is regularized so that the LF susceptibility difference becomes minimum, as shown in equation (11). For this reason, the second susceptibility $\chi_2$ in the region that contributes to high contrast, such as blood vessel lumen, becomes a value in the vicinity of the LF average susceptibility in the LF region in the second susceptibility map. In other words, the second susceptibility $\chi_2$ of the region that contributes to high contrast in the LF region in the second susceptibility map is reduced. As the susceptibility of the region that contributes to high contrast, the first susceptibility $\chi_1$ is selected, as will be described with reference to step Sb6 below.

(Step Sb6)

The processing circuitry 131 generates, by the susceptibility map generation function 1315, a high-precision susceptibility map based on the first susceptibility map and the second susceptibility map. Specifically, in each of the voxels in the imaging region, the processing circuitry 131 generates a high-precision susceptibility map using either one of the first susceptibility $\chi_1$ and the second susceptibility $\chi_2$ of the voxels in the same position (hereinafter, the same voxels). In more detail, the processing circuitry 131 selects larger susceptibility among the first susceptibility $\chi_1$ and the second susceptibility $\chi_2$ in the same voxels. The selection of susceptibility that is performed in the processing circuitry 131 can be expressed as the following equation (12), wherein the susceptibility of the position x in the high-precision susceptibility map is represented by $\chi_{ha}(x)$, the susceptibility of the position x in the first susceptibility map is represented by $\chi_1(x)$, and the susceptibility of the position x in the second susceptibility map is represented by $\chi_2(x)$.

$$\chi_{ha}(x) = \max(\chi_1(x), \chi_2(x)) \quad (12)$$

Specifically, the processing circuitry 131 selects, by the susceptibility map generation function 1315, the second susceptibility $\chi_2$ as susceptibility of the region associated with a shading artifact in the LF region. In addition, the processing circuitry 131 selects the first susceptibility $\chi_1$ as the susceptibility of the region that contributes to high contrast in the LF region. The processing circuitry 131 thus calculates a high-precision susceptibility map in which a dark sunken area due to a shading artifact in the LF region is reduced and the susceptibility of the region that contributes to high contrast in the LF region is maintained.

The processing circuitry 131 may generate a high-precision susceptibility map using a susceptibility difference by calculating a difference between susceptibility selected in each of the positions in the imaging region and susceptibility (offset) in a reference point in the imaging region. The processing circuitry 131 may colorize the high-precision susceptibility map and generate an image superimposed on the gray scale magnitude image (high-precision susceptibility superimposed image). The processing circuitry 131 outputs the generated high-precision susceptibility map and high-precision susceptibility-superimposed image, etc. to the display 127. The display 127 displays a high-precision susceptibility map and a high-precision susceptibility-superimposed image, etc.

By the processing in step Sb5 and the processing in step Sb6, the processing circuitry 131 generates, by the susceptibility map generation function 1315, first susceptibility in each of the voxels in the imaging region based on a relaxation time map and magnetic field distribution generated by a plurality of phase images corresponding to a plurality of echo times, generates second susceptibility in each voxel based on the magnetic field distribution, the relaxation time map, and a specified region (LF region mask $M_{LF}$) and generates a high-precision susceptibility map using a larger susceptibility among the first susceptibility and the second susceptibility.

The above-described configuration has the following advantages in addition to the advantages of the first embodiment.

According to the MRI apparatus 100 in the present embodiment, it is possible to generate a relaxation time map of tissue based on a plurality of magnitude images corresponding to a plurality of echo times, to specify a region associated with occurrence of a partial volume in an imaging region based on the generated relaxation time map, the magnitude images, and a plurality of anatomical landmarks in the magnitude images, to generate first susceptibility in each of the voxels in the imaging region based on the relaxation time map and magnetic field distribution generated by a plurality of phase images corresponding to the plurality of echo times, to generate second susceptibility in each of the voxels based on the magnetic field distribution, the relaxation time map, and the specified region, and to generate a susceptibility map using larger susceptibility among the first susceptibility and the second susceptibility in each of the voxels. Specifically, according to the MRI apparatus 100 of the present embodiment, it is possible to generate an edge mask by performing edge detection to a relaxation time map, to generate first susceptibility by first optimization processing with a first regularization term using the generated edge mask for smoothing the susceptibility in a non-edge region in the relaxation time map, and to generate second susceptibility by second optimization processing with a second regularization term that suppresses, by using the edge mask, the susceptibility in the specified region to average susceptibility and a first regularization term.

In other words, according to the present MRI apparatus 100, it is possible to calculate second susceptibility by using a second evaluation function $f_2(x)$ having L2 norm regularization using an LF region mask $M_{LF}$ generated based on an edge mask $M_{R2}^*$, a magnitude image $G_{SG}(M_{mag})$, and an LF plane mask image $M_{LFP}$. Thus, with the optimization method in the present embodiment, it is possible to suppress smoothing of susceptibility in a tissue boundary, and to smooth susceptibility in a non-tissue boundary (non-edge portion in an $R_2^*$ map), and to generate a second susceptibility map in which a reduction in susceptibility associated with shading artifact in an LF region is suppressed. In addition, according to the MRI apparatus 100 in the present embodiment, it is possible to generate a high-precision susceptibility map using the larger susceptibility among the first susceptibility $\chi_1$ and the second susceptibility $\chi_2$ in the same voxels.

In other words, in an LF region, the first susceptibility $\chi_1$ is selected as susceptibility in a high-contrast region that includes a large amount of iron, such as blood vessels, and the second susceptibility $\chi_2$ is selected as a susceptibility in a region corresponding to CSF which is greatly affected by a partial volume effect. Thus, in the LF region, it is possible to generate a high-precision susceptibility map in which susceptibility associated with a shading artifact is reduced and susceptibility in a region that contributes to high contrast is maintained. In other words, according to the present MRI apparatus 100, it is possible to further suppress a shading artifact due to a partial volume effect and to generate a high-precision susceptibility map.

Figure 17:
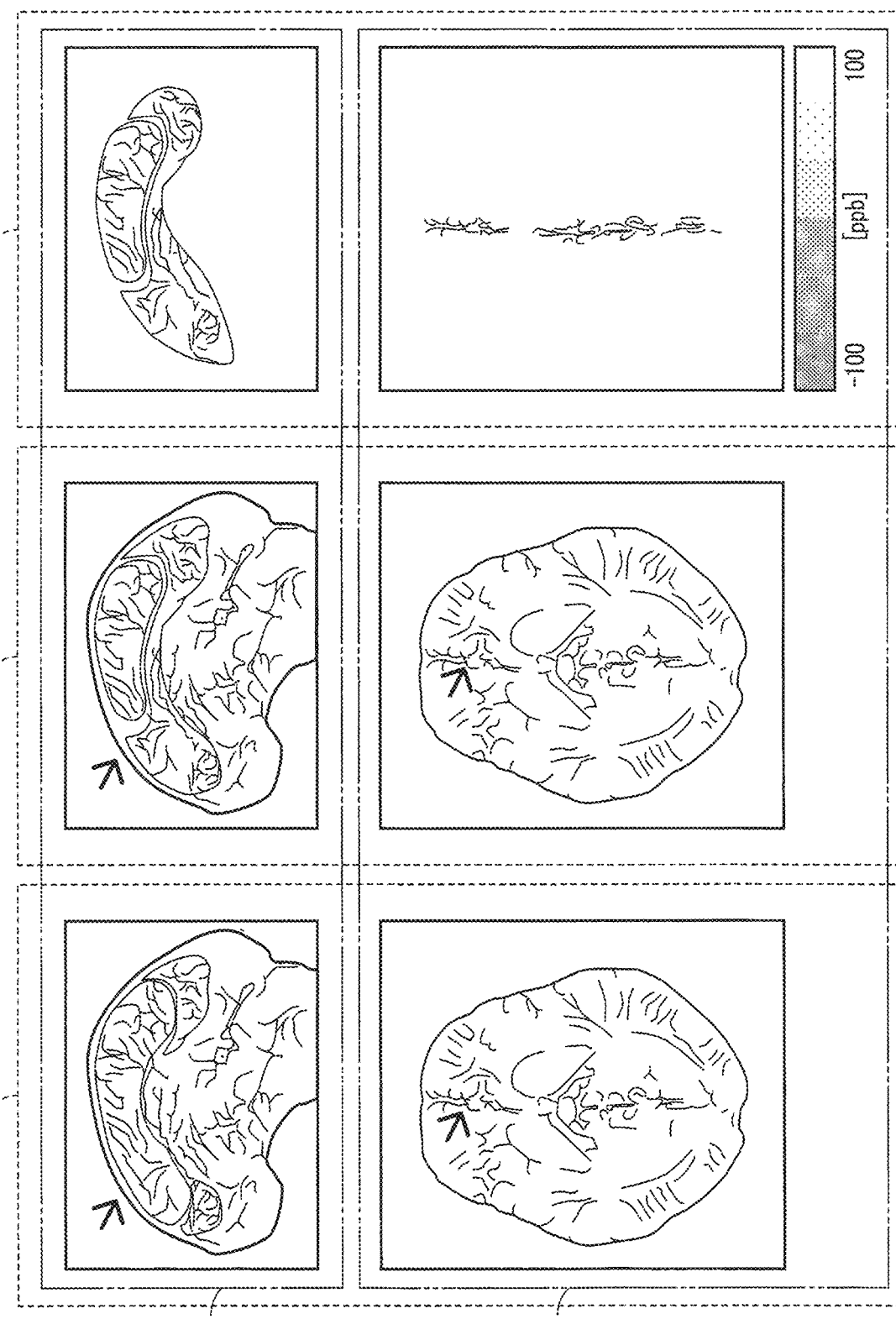
FIG. 17 is a drawing showing a first susceptibility map, a high-precision susceptibility map, and a difference therebetween in both of an axial plane and a sagittal plane in the second embodiment.

FIG. 17 is a drawing showing a first susceptibility map, a high-precision susceptibility map, and a difference therebetween in both of an axial plane and a sagittal plane. As indicated by the arrows in FIG. 17, a shading artifact is further reduced in the high-precision susceptibility map, compared to the first susceptibility map. A difference between the first susceptibility map and the high-precision susceptibility map appears in the LF region.

FIG. 18 is a drawing showing a distribution of susceptibility $\chi_{ha}$ of a high-precision susceptibility map with respect to first susceptibility $\chi_1$ in a non-LF region. As shown in FIG. 18, there is no change in the first susceptibility $\chi_1$ in the non-LF region and the susceptibility $\chi_{ha}$ in the high-precision susceptibility map.

As shown in FIGS. 17 and 18, according to the present embodiment, there is no change in susceptibility in the non-LF region, and a shading artifact in the LF region can be selectively suppressed. Since an LF region is specified for each subject, it is possible to appropriately detect an LF region in a subject that is diagonally inserted into the bore 111, a subject having an uneven-sized left hemisphere and right hemisphere of the cerebrum, or a subject having a distorted cerebrum. Thus, according to the present embodiment, it is possible to generate a high-precision susceptibility map in which a shading artifact is selectively suppressed for any of the foregoing subjects.

Therefore, a susceptibility map generated by the various processings in the present embodiment is displayed on a display with reduced shading artifacts due to a partial volume effect, and can improve diagnosis efficiency.

As a modification of the first embodiment, when the technical idea of the present MRI apparatus 100 is realized on a medical image processing apparatus 135, the apparatus 135 includes, for example, the structural elements enclosed with the broken line in the configuration diagram of FIG. 1. As a modification of the second embodiment, when the technical idea of the present MRI apparatus 100 is realized on a medical image processing apparatus 135, the apparatus 135 includes, for example, the structural elements enclosed with the broken line in the configuration diagram of FIG. 11. The medical processing apparatus 135 performs various types of processing using MR data stored in the storage apparatus 129. For example, the processing in step Sa1 in the flowchart of FIG. 3 would be "read MR data from the memory apparatus 129". Since advantageous effects achieved by the medical image processing apparatus 135 are the same as those achieved by the present embodiment, the description thereof is omitted.

As modifications of the first and second embodiments, if the technical idea of the present MRI apparatus 100 is realized by cloud computing or the like, a server on the Internet may have the storage apparatus 129 and the processing circuitry 131 shown in the schematic diagrams of FIGS. 1 and 11. At this time, the image generation function 1313, the susceptibility map generation function 1315, the region specifying function 1317, etc. are realized by installing a program (a medical processing program) that executes these functions onto the processing apparatus 131 of a server and expanding these functions in a memory.

In addition, the image generation function 1313, the susceptibility map generation function 1315, the region specifying function 1317, etc. of the first and second embodiments can also be realized by installing a program (medical processing program) that executes these functions in a computer, such as a work station, and expanding these functions in a memory. A program that causes a computer to execute a susceptibility map generation method shown in FIG. 2 and a high-precision susceptibility map generation method shown in FIG. 12 can be stored and distributed on various types of portable storage medium such as a magnetic disc, an optical disc, or a semiconductor memory.

As a modification of the second embodiment, the processing circuitry 131 may generate, by the susceptibility map generation function 1315, a high-precision susceptibility map by applying equation (12) to susceptibility values included in the LF region in the first and second susceptibility maps.

According to the above-described first and second embodiments, a high-precision susceptibility map can be generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
sequence control circuitry configured to collect MR data corresponding to each of a plurality of echo times; and
processing circuitry configured to
generate a plurality of magnitude images corresponding to the plurality of echo times based on the MR data,
generate a relaxation time map of tissue based on the plurality of magnitude images, and
generate a susceptibility map that quantitatively indicates susceptibility values in a subject based on the relaxation time map and a magnetic field distribution generated by a plurality of phase images corresponding to the plurality of echo times,
wherein
the processing circuitry generates an edge mask by executing edge detection to the relaxation time map, and generates the susceptibility map by optimization processing with a regularization term using the edge mask for smoothing susceptibility within a non-edge portion in the relaxation time map.

2. The magnetic resonance imaging apparatus according to claim 1, wherein
the processing circuitry generates the relaxation time map by performing fitting to a distribution of magnitude signals in a same position in a plurality of magnitude images.

3. The magnetic resonance imaging apparatus according to claim 1, wherein
the processing circuitry generates the susceptibility map by suppressing a gradient of susceptibility relating to a region divided using the relaxation time map or by suppressing an absolute value of the gradient.

4. A magnetic resonance imaging apparatus comprising:
sequence control circuitry configured to collect MR data corresponding to each of a plurality of echo times; and
processing circuitry configured to
generate a plurality of magnitude images corresponding to the plurality of echo times based on the MR data,
generate a relaxation time map of tissue based on the plurality of magnitude images,
specify a region associated with occurrence of partial volume in an imaging region based on the relaxation time map, the magnitude images, and a plurality of anatomical landmarks in the magnitude images,
generate a mask image including the specified region,
generate a first susceptibility in each of a plurality of voxels in the imaging region based on a magnetic field distribution generated by a plurality of phase images corresponding to the plurality of echo times, and the relaxation time map,
generate a second susceptibility in each of the plurality of voxels in the imaging region based on the magnetic field distribution, the relaxation time map, and the mask image, and
generate a susceptibility map using a larger susceptibility among the first susceptibility and the second susceptibility in each of the voxels.

5. The magnetic resonance imaging apparatus according to claim 4, wherein
the processing circuitry
generates an edge mask by executing edge detection to the relaxation time map,
generates the first susceptibility by performing first optimization processing with a first regularization term using the edge mask for smoothing susceptibility within a non-edge portion in the relaxation time map, and
generates the second susceptibility by performing second optimization processing with the first regularization term and a second regularization term that suppresses, by using the edge mask, susceptibility in the specified region to average susceptibility in the region.

6. A medical image processing apparatus comprising:
processing circuitry configured to
generate a relaxation time map of tissue based on a plurality of magnitude images corresponding to a plurality of echo times, and
generate a susceptibility map that quantitatively indicates susceptibility values in a subject based on the relaxation time map and magnetic field distribution generated by a plurality of phase images corresponding to the plurality of echo times, wherein the processing circuitry generates an edge mask by executing edge detection to the relaxation time map, and generates the susceptibility map by optimization processing with a regularization term using the edge mask for smoothing susceptibility within a non-edge portion in the relaxation time map.

* * * * *